US012660378B2

(12) United States Patent
Honda et al.

(10) Patent No.: US 12,660,378 B2
(45) Date of Patent: Jun. 16, 2026

(54) TRANSMISSIVE FLUORESCENCE EMITTING MODULE AND LIGHT EMITTING DEVICE

(71) Applicant: Panasonic Intellectual Property Management Co., Ltd., Osaka (JP)

(72) Inventors: Yosuke Honda, Nara (JP); Shinichi Kitaoka, Osaka (JP); Noriyasu Nakashima, Osaka (JP); Yoshiyuki Takahira, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 429 days.

(21) Appl. No.: 18/038,570

(22) PCT Filed: Oct. 20, 2021

(86) PCT No.: PCT/JP2021/038702
§ 371 (c)(1),
(2) Date: May 24, 2023

(87) PCT Pub. No.: WO2022/118556
PCT Pub. Date: Jun. 9, 2022

(65) Prior Publication Data
US 2024/0006555 A1 Jan. 4, 2024

(30) Foreign Application Priority Data

Dec. 4, 2020 (JP) ................................. 2020-202014

(51) Int. Cl.
*H10H 20/822* (2025.01)
*H10H 20/85* (2025.01)
(Continued)

(52) U.S. Cl.
CPC ...... *H10H 20/822* (2025.01); *H10H 20/8506* (2025.01); *H10H 20/8583* (2025.01); *H10H 20/036* (2025.01)

(58) Field of Classification Search
None
See application file for complete search history.

(56) References Cited

U.S. PATENT DOCUMENTS

2015/0241046 A1* 8/2015 Hagemann ............. G03B 21/16
362/84
2017/0261844 A1* 9/2017 Kitade ................. H04N 9/3158
(Continued)

FOREIGN PATENT DOCUMENTS

CN 104865779 8/2015
JP 2012-9242 1/2012
(Continued)

OTHER PUBLICATIONS

International Search Report issued in International Patent Application No. PCT/JP2021/038702, dated Nov. 22, 2021.
(Continued)

*Primary Examiner* — Bilkis Jahan
(74) *Attorney, Agent, or Firm* — Greenblum & Bernstein, P.L.C.

(57) ABSTRACT

A transmissive fluorescence emitting module includes: a fluorescent substrate that consists essentially of a fluorescent material; a metal member bonded to a principal surface that the fluorescent substrate includes; and a rotator that rotates the fluorescent substrate and the metal member about an axis extending in a thickness direction of the fluorescent substrate. In a plan view of the fluorescent substrate, the fluorescent substrate includes a region that does not overlap the metal member, the region being annular ring-shaped.

9 Claims, 13 Drawing Sheets

(51) Int. Cl.
   *H10H 20/858*     (2025.01)
   *H10H 20/01*     (2025.01)

(56)         References Cited

U.S. PATENT DOCUMENTS

| | | | | |
|---|---|---|---|---|
| 2018/0088317 A1* | 3/2018 | Yoshikawa | .............. | G02B 5/20 |
| 2018/0299756 A1* | 10/2018 | Maeda | ..................... | F21V 9/32 |
| 2021/0286165 A1 | 9/2021 | Asano | | |

FOREIGN PATENT DOCUMENTS

| | | | | | |
|---|---|---|---|---|---|
| JP | 2012-181431 | | 9/2012 | | |
| JP | 2016-170326 | * | 9/2016 | .............. | G02B 5/28 |
| JP | 2017-151213 | * | 8/2017 | ............ | G03B 21/14 |
| JP | 2018-22000 | | 2/2018 | | |
| JP | 2018-055055 | * | 4/2018 | .............. | H05K 7/20 |
| JP | 2018-55055 | | 4/2018 | | |
| JP | 2019-519100 | | 7/2019 | | |
| WO | 2017/098706 | | 6/2017 | | |
| WO | 2017/154048 | | 9/2017 | | |
| WO | 2017/196779 | | 11/2017 | | |
| WO | 2018/074125 | | 4/2018 | | |

OTHER PUBLICATIONS

Japan, Notice of Reasons for Refusal received in JP Application No. 2024-084045, dated Jul. 22, 2025, and English language translation thereof.

* cited by examiner

500

L2

TRANSMISSIVE FLUORESCENCE EMITTING MODULE AND LIGHT EMITTING DEVICE

TECHNICAL FIELD

The present invention relates to a transmissive fluorescence emitting module and a light emitting device.

BACKGROUND ART

A conventional transmissive fluorescence emitting module that generates fluorescence by being excited by excitation light has been known. A transmissive fluorescence emitting module is applied to a light emitting device such as a projector, for example.

Patent Literature (PTL) 1 discloses a light source device as an example of a transmissive fluorescence emitting module. This light source device (the transmissive fluorescence emitting module) includes a substrate for fluorescence formed of a plate-shaped glass member, a fluorescence generator, a dichroic film located between the substrate for fluorescence and the fluorescence generator, and a light emitter that emits excitation light that excites the fluorescence generator.

CITATION LIST

Patent Literature

[PTL 1] Japanese Unexamined Patent Application Publication No. 2012-9242

SUMMARY OF INVENTION

Technical Problem

By the way, if the temperature of the fluorescence generator is increased by being irradiated with excitation light, a phenomenon in which less fluorescence is generated (a so-called thermal quenching phenomenon) occurs, which is known. For example, with the transmissive fluorescence emitting module disclosed in PTL 1, a thermal quenching phenomenon readily occurs due to insufficient heat dissipation of the fluorescence generator, and as a result, the fluorescence generator emits less fluorescence. Accordingly, efficiency of light usage achieved by such a transmissive fluorescence emitting module may be low.

In view of this, the present invention provides a transmissive fluorescence emitting module and a light emitting device that achieve high efficiency of light usage.

Solution to Problem

A transmissive fluorescence emitting module according to an aspect of the present invention includes: a fluorescent substrate that consists essentially of a fluorescent material; a metal member bonded to a principal surface that the fluorescent substrate includes; and a rotator that rotates the fluorescent substrate and the metal member about an axis extending in a thickness direction of the fluorescent substrate. In a plan view of the fluorescent substrate, the fluorescent substrate includes a region that does not overlap the metal member, the region being annular ring-shaped.

A light emitting device according to an aspect of the present invention includes the transmissive fluorescence emitting module stated above.

Advantageous Effects of Invention

According to the present invention, a transmissive fluorescence emitting module and a light emitting device that achieve high efficiency of light usage can be provided.

DESCRIPTION OF EMBODIMENTS

Figure 1A:
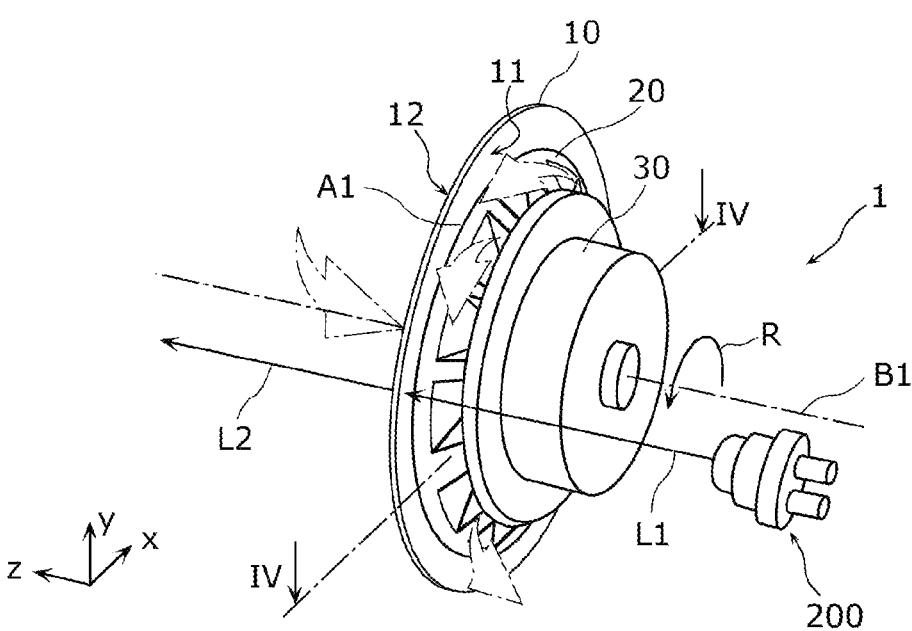
FIG. 1A is a perspective view of a transmissive fluorescence emitting module according to an embodiment.

The following describes in detail a transmissive fluorescence emitting module, for instance, according to embodiments of the present invention, with reference to the drawings.

Note that the embodiments described below each show a general or specific example. The numerical values, shapes, materials, elements, the arrangement and connection of the elements, manufacturing processes, and the processing order of the manufacturing processes, for instance, described in the following embodiments are examples, and thus are not intended to limit the present invention.

In addition, the drawings are schematic diagrams, and do not necessarily provide strictly accurate illustration. Accordingly, scaling, for example, is not necessarily consistent throughout the drawings. In the drawings, the same sign is given to substantially the same configuration, and a redundant description thereof is omitted or simplified.

In the Specification, a term that indicates a relation between elements such as parallel or orthogonal, a term that indicates the shape of an element such as circular, and a numerical range do not necessarily have only strict meanings, and also cover substantially equivalent ranges that include a difference of about several percent, for example.

In the Specification and the drawings, the x axis, the y axis, and the z axis represent three axes of a three-dimensional orthogonal coordinate system. In the embodiments, two axes parallel to a third principal surface that a fluorescent substrate includes are referred to as an x axis and a y axis, and an axis orthogonal to the x axis and the y axis is referred to as a z axis.

EMBODIMENT

[Configuration]

Figure 1B:
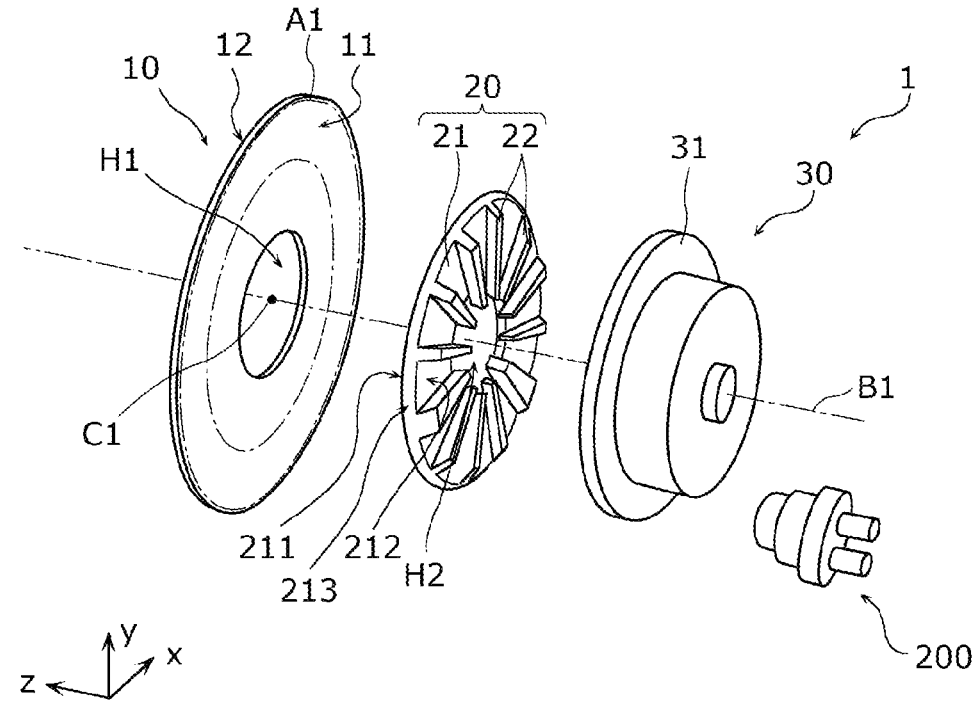
FIG. 1B is an exploded perspective view of the transmissive fluorescence emitting module according to the embodiment.

First, a configuration of transmissive fluorescence emitting module 1 according to the present embodiment is to be described with reference to the drawings. FIG. 1A is a perspective view of transmissive fluorescence emitting module 1 according to the present embodiment. FIG. 1B is an exploded perspective view of transmissive fluorescence emitting module 1 according to the present embodiment.

As illustrated in FIG. 1A and FIG. 1B, transmissive fluorescence emitting module 1 includes fluorescent substrate 10 consisting essentially of a fluorescent material, metal member 20, rotator 30, and two light emitters 200. Note that FIG. 1A and FIG. 1B illustrate one light emitter 200 for convenience. One light emitter 200 is similarly illustrated in some of the drawings described below. Transmissive fluorescence emitting module 1 may include single light emitter 200. Transmissive fluorescence emitting module 1 is used in a light emitting device typified by a projector and an illumination device, as an example. In the present embodiment, transmissive fluorescence emitting module 1 is used in a projector.

In the present embodiment, rotator 30 rotates fluorescent substrate 10, for instance, about axis B1 in the direction of arrow R illustrated in FIG. 1A and furthermore, fluorescent substrate 10 emits transmitted light L2 that includes fluorescence by receiving excitation light L1. Transmissive fluorescence emitting module 1 is a light-transmissive module that uses transmitted light L2 as projection light that the projector outputs. Thus, fluorescent substrate 10 is used as a light-transmissive fluorescent wheel.

The following describes elements included in transmissive fluorescence emitting module 1.

First, light emitter 200 is to be described.

Light emitter 200 is a light source that emits excitation light L1. Excitation light L1 excites a fluorescent material included in fluorescent substrate 10. Light emitter 200 is, for example, a semiconductor laser light source or a light emitting diode (LED) light source, and emits excitation light L1 having a predetermined color (wavelength) by being driven by a driving current.

In the present embodiment, light emitters 200 are semiconductor laser light sources. Note that semiconductor laser elements included in light emitters 200 are GaN-based semiconductor laser elements (laser chips) consisting essentially of a nitride semiconductor material, for example. In the present embodiment, light emitters 200 that are semiconductor laser light sources are collimator lens integrated light emitting devices of a TO-CAN type. Note that light emitters 200 may be multi-chip lasers as disclosed in Japanese Unexamined Patent Application Publication No. 2016-219779 or may each include a collimator lens and a TO-CAN separately.

As an example, light emitters 200 each emit, as excitation light L1, a laser beam in a range from near ultra violet light to blue light, which has a peak wavelength in a range from 380 nm to 490 nm. At this time, excitation light L1 has a peak wavelength of 455 nm, for example, and is blue light.

Next, fluorescent substrate 10 is to be described.

Fluorescent substrate 10 is a plate-shaped substrate that includes two principal surfaces on opposite sides from each other. The two principal surfaces are third principal surface 11 and fourth principal surface 12. Here, third principal surface 11 and fourth principal surface 12 are flat.

Figure 2:
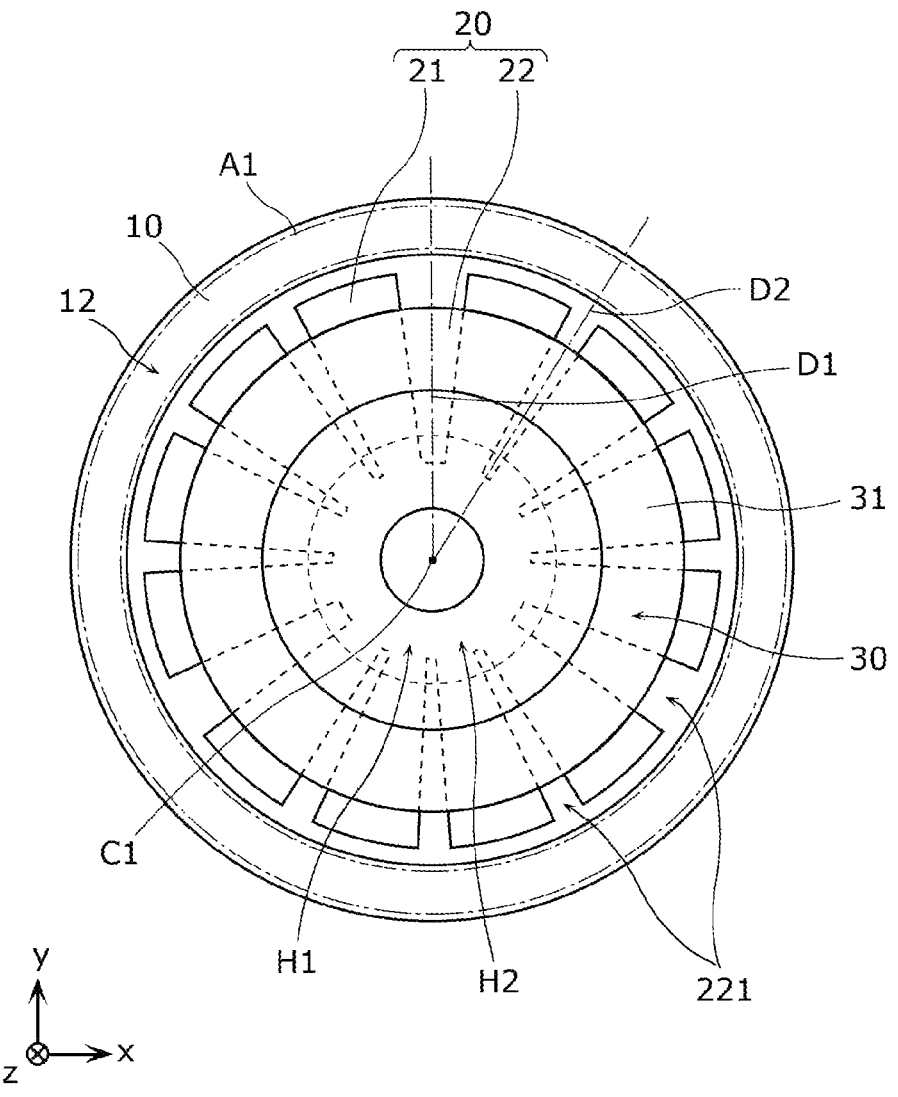
FIG. 2 is a plan view of a fluorescent substrate, a metal member, and a rotator according to the embodiment.
Figure 3:
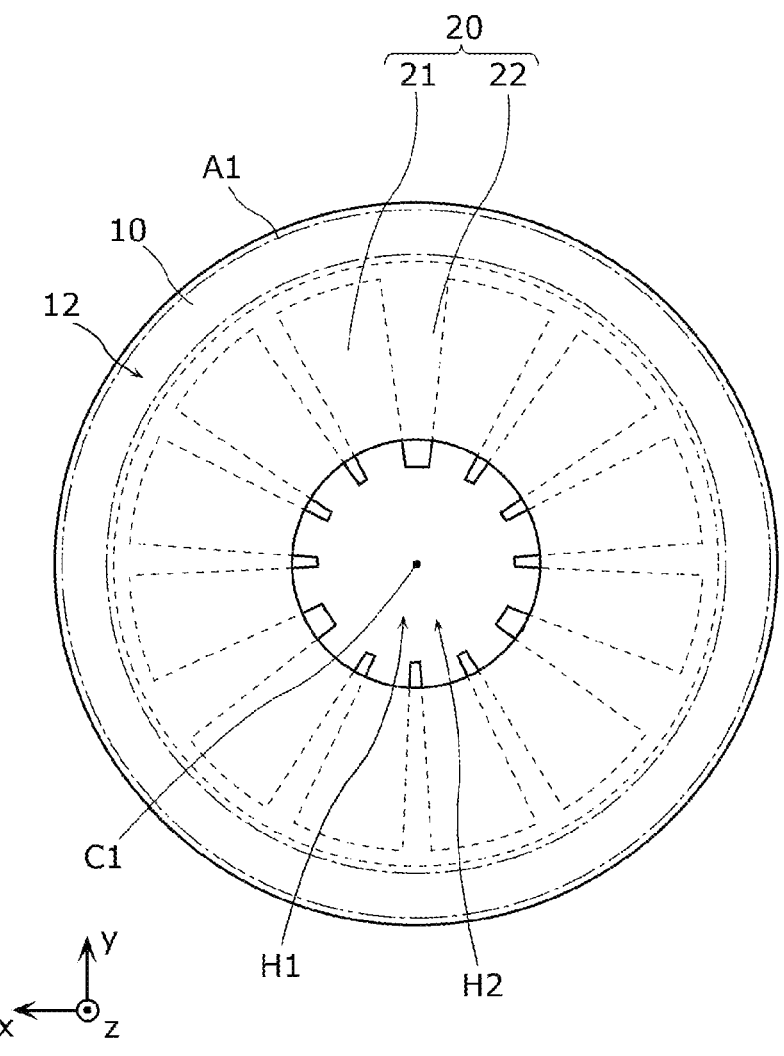
FIG. 3 is a bottom view of the fluorescent substrate and the metal member according to the embodiment.

Furthermore, fluorescent substrate 10 is to be described in detail, with reference to FIG. 2 and FIG. 3.

FIG. 2 is a plan view of fluorescent substrate 10, metal member 20, and rotator 30 according to the present embodiment. In FIG. 2, light emitters 200 are omitted. FIG. 3 is a bottom view of fluorescent substrate 10 and metal member 20 according to the present embodiment. In FIG. 3, rotator 30 and light emitters 200 are omitted. Note that a view of transmissive fluorescence emitting module 1 in the negative z-axis direction is a plan view, whereas a view of transmissive fluorescence emitting module 1 in the positive z-axis direction is a bottom view. The plan view is a view from the top, and the bottom view is a view from the underside.

Fluorescent substrate 10 is circularly shaped in the plan view, and thus has a circular plate shape. Here, the center of the circular shape that fluorescent substrate 10 has is center point C1. Furthermore, fluorescent substrate 10 has first through-hole H1, and thus has an annular ring shape, more specifically. First through-hole H1 is a hole penetrating through fluorescent substrate 10 in the thickness direction of fluorescent substrate 10 (the z-axis direction), and has a circular shape in the plan view. The center of the circular shape that first through-hole H1 has overlaps center point C1. Thus, fluorescent substrate 10 is provided in a circular ring shape on a circumference equally distant from center point C1 of fluorescent substrate 10, and in a belt shape along the circumferential direction in the plan view.

The outside diameter (that is, the diameter of an outer circle in the bottom view in FIG. 3) of fluorescent substrate 10 having an annular ring shape is preferably in a range from 30 mm to 90 mm, more preferably in a range from 35 mm to 70 mm, and yet more preferably in a range from 40 mm to 50 mm, but the outside diameter is not limited thereto. When transmissive fluorescence emitting module 1 is applied to a projector, the outside diameter of fluorescent substrate 10 is determined to allow fluorescent substrate 10 to fit in the casing of the projector.

Further, the inside diameter (that is, the diameter of the inner circle in the bottom view in FIG. 3) of fluorescent substrate 10 is smaller than the outside diameter of fluorescent substrate 10, and is preferably in a range from 15 mm to 45 mm, more preferably in a range from 17.5 mm to 35 mm, and yet more preferably in a range from 20 mm to 25 mm, as an example, but the inside diameter is not limited thereto. The inside diameter of fluorescent substrate 10 is the diameter of first through-hole H1.

The thickness of fluorescent substrate 10 (that is, the length thereof in the z-axis direction) may be in a range from 50 μm to 700 μm. The thickness of fluorescent substrate 10 is preferably in a range from 80 μm to 500 μm, and more preferably in a range from 100 μm to 300 μm.

Fluorescent substrate 10 consists essentially of a fluorescent material. Stated differently, fluorescent substrate 10 is a member made of a fluorescent material that is a principal component. More specifically, fluorescent substrate 10 is a substrate that consists essentially of a sintered fluorescent substance made of a fluorescent material.

Note that here, a sintered fluorescent substance in this Specification is to be described.

A sintered fluorescent substance is a baked body obtained by baking raw-material powder of the above fluorescent material that is a principal component (an example of which is a granulated body obtained by granulating raw-material power of the fluorescent material) at a temperature lower than the melting point of the fluorescent material. During the baking process, raw-material powder particles of the sintered fluorescent substance are bonded. Accordingly, the sintered fluorescent substance requires almost no binder for bonding granulated bodies. More specifically, the sintered fluorescent substance does not need a binder at all. An example of a binder is a transparent resin in PTL 1 stated above. Further, a known material such as an $Al_2O_3$ material or a glass material (that is, $SiO_d$ ($0 < d \leq 2$)) is used for the binder. Note that similarly, not just the binder, the sintered fluorescent substance needs almost no material (hereinafter, another material) other than a fluorescent material included in the sintered fluorescent substance, or more specifically, does not require none of such another material.

For example, when the entire volume of the sintered fluorescent substance is considered to be 100 vol %, the volume of the fluorescent material may occupy 70 vol % or more of the entire volume of the sintered fluorescent substance. Further, the volume of the fluorescent material occupies preferably 80 vol % or more, more preferably 90 vol % or more, or yet more preferably 95 vol % or more of the entire volume of the sintered fluorescent substance.

Note that stated differently, when the entire volume of the sintered fluorescent substance is considered to be 100 vol %, the volume of another material (for example, a binder) may occupy less than 30 vol % of the entire volume of the sintered fluorescent substance. Further, the volume of another material (for example, a binder) occupies preferably 20 vol % or less, more preferably 10 vol % or less, or yet more preferably 5 vol % or less of the entire volume of the sintered fluorescent substance.

If the volume percent of another material in the entire volume of the sintered fluorescent substance is high (or in other words, the proportion of the volume of another material is high), phonon scattering occurs due to a defect present at the interface between the fluorescent material and another material. As a result, thermal conductivity of the sintered fluorescent substance decreases. In particular, if the volume of another material occupies 30 vol % or more, thermal conductivity significantly decreases. Further, more non-radiative recombination occurs at the interface, and efficiency of light emission decreases. In other words, the lower the volume percent of another material (or in other words, the proportion of the volume of another material) in the entire volume of the sintered fluorescent substance is, the higher the thermal conductivity and efficiency of light emission become. The sintered fluorescent substance according to the present invention includes another material, the volume of which is less than 30 vol % in the entire volume of the sintered fluorescent substance.

Here, a fluorescent material is to be described.

The fluorescent material consists essentially of a crystalline phase having a garnet structure, for example. The garnet structure is a crystalline structure represented by the general formula $A_3B_2C_3O_{12}$. One or more rare earth elements such as Ca, Y, La, Ce, Pr, Nd, Sm, Eu, Gd, Tb, and Lu are used as element A, and one or more elements such as Mg, Al, Si, Ga, and Sc are used as element B, and one or more elements such as Al, Si, and Ga are used as element C. Examples of such a garnet structure include yttrium aluminum garnet (YAG), lutetium aluminum garnet (LuAG), lutetium calcium magnesium silicon garnet ($Lu_2CaMg_2Si_3O_{12}$), and terbium aluminum garnet (TAG). In the present embodiment, the fluorescent material consists essentially of the crystalline phase represented by $(Y_{1-x}Ce_x)_3Al_2Al_3O_{12}$ (that is, $(Y_{1-x}Ce_x)_3Al_5O_{12}$) ($0.0001 \leq x < 0.1$), stated differently, YAG.

When the fluorescent material consists essentially of YAG, there are cases where $Al_2O_3$ is used as the raw material. In this case, there are cases where $Al_2O_3$ remains as an unreacted raw material in the sintered fluorescent substance. However, $Al_2O_3$ that is an unreacted raw material is different from the binder described above. If the entire volume of the sintered fluorescent substance is considered to be 100 vol %, the volume of $Al_2O_3$ that is an unreacted raw material in the entire volume of the sintered fluorescent substance is 5 vol % or less.

Note that the crystalline phase included in the fluorescent material may be a solid solution that includes a plurality of garnet crystalline phases having different chemical compositions. An example of such a solid solution is a solid solution $((1-a)(Y_{1-x}Ce_x)_3Al_5O_{12}\cdot a(Lu_{1-y}Ce_y)_3Al_2Al_3O_{12}$ ($0 < a < 1$)) that includes a garnet crystalline phase represented by $(Y_{1-x}Ce_x)_3Al_2Al_3O_{12}$ ($0.001 \leq x < 0.1$) and a garnet crystalline phase represented by $(Lu_{1-y}Ce_y)_3Al_2Al_3O_{12}$ ($0.001 \leq y < 0.1$). Further, an example of such a solid solution is a solid solution $((1-b)(Y_{1-x}Ce_x)_3Al_2Al_3O_{12}\cdot b(Lu_{1-z}Ce_z)_2CaMg_2Si_3O_{12}$ ($0 < b < 1$)) that includes a garnet crystalline phase represented by $(Y_{1-x}Ce_x)_3Al_2Al_3O_{12}$ ($0.001 \leq x < 0.1$) and a garnet crystalline phase represented by $(Lu_{1-z}Ce_z)_2CaMg_2Si_3O_{12}$ ($0.0015 \leq z < 0.15$). The fluorescent material consists essentially of a solid solution that includes a plurality of garnet crystalline phases having different chemical compositions, and thus the spectrum of fluorescence emitted by the fluorescent material is further increased and includes more green light components and more red light components. Accordingly, a projector that emits projection light having a wide color gamut can be provided.

The crystalline phases included in the fluorescent material may include a crystalline phase having a chemical composition that deviates from the crystalline phase represented by the above-stated general formula $A_3B_2C_3O_{12}$. An example of such a crystalline phase is $(Y_{1-x}Ce_x)_3Al_{2+\delta}Al_3O_{12}$ (where δ is a positive number) that includes richer Al than the crystalline phase represented by $(Y_{1-x}Ce_x)_3Al_2Al_3O_{12}$ ($0.001 \leq x < 0.1$). Further, another example of such a crystalline phase is $(Y_{1-x}Ce_x)_3+Al_2Al_3O_{12}$ (where r is a positive number) that includes richer Y than the crystalline phase represented by $(Y_{1-x}Ce_x)_3Al_2Al_3O_{12}$ ($0.001 \leq x < 0.1$). Such crystalline phases have chemical compositions that deviate from the crystalline phase represented by the general formula $A_3B_2C_3O_{12}$, but maintain the garnet structure.

Furthermore, the crystalline phases included in the fluorescent material may include a different crystalline phase having a structure other than the garnet structure.

Fluorescent substrate 10 includes region A1 that is annular ring-shaped and does not overlap metal member 20 in the plan view. In FIG. 1B, FIG. 2, and FIG. 3, region A1 corresponds to a region between two circles indicated by the dash-dot lines. The center of the annular ring shape that is the shape of region A1 overlaps center point C1 of fluorescent substrate 10. Excitation light L1 enters region A1. More specifically, excitation light L1 emitted from light emitters 200 enters region A1 through third principal surface 11 (that is from the z-axis negative side).

In region A1 that fluorescent substrate 10 includes, the fluorescent material that consists essentially of YAG receives excitation light L1 and emits fluorescence. More specifically, the fluorescent material is irradiated with excitation light L1, and thus emits fluorescence as wavelength-converted light. Hence, the wavelength-converted light emitted from the fluorescent material has a wavelength longer than the wavelength of excitation light L1.

In the present embodiment, wavelength-converted light emitted from the fluorescent material includes fluorescence that is yellow light. For example, the fluorescent material absorbs light having a wavelength in a range from 380 nm to 490 nm, and emits fluorescence that is yellow light and has a peak wavelength in a range from 490 nm to 580 nm. Since the fluorescent material consists essentially of YAG, the fluorescent material can readily emit fluorescence having a peak wavelength in a range from 490 nm to 580 nm.

In the present embodiment, as illustrated in FIG. 1A, the wavelength of a portion of excitation light L1 that has entered is converted by the fluorescent material, and the portion of excitation light L1 passes through fluorescent substrate 10 and exits through fourth principal surface 12. Further, the wavelength of another portion of excitation light L1 that has entered is not converted by the fluorescent material, and the other portion of excitation light L1 passes through fluorescent substrate 10 and exits through fourth principal surface 12. Transmitted light L2 passing through fluorescent substrate 10 includes fluorescence that is yellow light having a converted wavelength and excitation light L1 that is blue light having a wavelength not converted. Thus, transmitted light L2 is a combination of such light, and is while light.

Fluorescent substrate 10 does not need to be supported by another element. Thus, fluorescent substrate 10 has a rigid property. Since fluorescent substrate 10 includes a sintered fluorescent substance and has a thickness in the above range, fluorescent substrate 10 has a rigid property. As compared with the fluorescence generator formed with a coating material that includes a fluorescent substance and a transparent resin, which is disclosed in PTL 1, fluorescent substrate 10 according to the present embodiment is much more rigid.

Next, metal member 20 is to be described.

Metal member 20 is an element consisting essentially of a metal material. Metal member 20 is bonded to one principal surface of fluorescent substrate 10. In the present embodiment, as illustrated in FIG. 1A and FIG. 1B, metal member 20 is located on the z-axis negative side with respect to fluorescent substrate 10, and is bonded to third principal surface 11. As will be described in detail later, as the material of metal member 20, Al that is light and highly heat-conductive is used, taking into consideration a load onto rotator 30 that is a motor and thermal conductivity.

In the present embodiment, metal member 20 is bonded to third principal surface 11 of fluorescent substrate 10 with a bonding layer being provided therebetween. In this case, a silicone resin is used for the bonding layer, in order to reduce a difference between thermal expansion coefficients of rotator 30 and fluorescent substrate 10. Note that another material such as Cu or Fe may be used as the material of rotator 30, and an adhesive member may also be another epoxy resin or a highly heat-conductive adhesive that contains nano Ag or nano Cu. The thickness of the bonding layer is preferably in a range from 5 μm to 40 μm, and more preferably in a range from 10 μm to 20 μm. Note that a structure may be adopted in which metal member 20 is in a direct contact with third principal surface 11 of fluorescent substrate 10 without using an adhesive. In this case, fluorescent substrate 10 may be sandwiched between metal member 20 and another member (not illustrated), and the metal member and the other member may be bonded with a bolt or a screw, for instance. Note that in the case of such a sandwiching structure that does not use an adhesive, the other member may consist essentially of a metal in view of heat dissipation, but may consist essentially of a resin material.

Furthermore, metal member 20 according to the present embodiment includes main body 21 and a plurality of radiator fins 22.

Main body 21 is a plate-shaped member provided, being stacked over fluorescent substrate 10. Main body 21 includes two principal surfaces on opposite sides from each other. The two principal surfaces are first principal surface 211 and second principal surface 212. First principal surface 211 and second principal surface 212 are planes parallel to each other, herein. In the present embodiment, main body 21 is bonded to third principal surface 11 of fluorescent substrate 10 with the bonding layer (not illustrated) being provided therebetween. More specifically, first principal surface 211 that main body 21 includes is bonded to third principal surface 11 of fluorescent substrate 10 with the bonding layer being provided therebetween. Since main body 21 has a plate shape, the area in which fluorescent substrate 10 and metal member 20 (here, main body 21) are bonded further increases. The plate shape that is the shape of main body 21 is not limited to a rectangular parallelepiped, and also means a cylindrical shape, a truncated cone shape, or the like.

As illustrated in FIG. 2 and FIG. 3, the shape of main body 21 is a circular shape in the plan view and the bottom view. The area of first principal surface 211 that main body 21 includes is greater than the area of second principal surface 212 that main body 21 includes. Thus, the shape of main body 21 is a truncated cone. Main body 21 that is truncated cone-shaped includes first side surface 213. First side surface 213 is a slanting surface that spreads from second principal surface 212 to first principal surface 211. First side surface 213 that is a slanting surface is not parallel to the z axis.

Second through-hole H2 is provided in main body 21, and thus the shape of main body 21 is a truncated cone shape provided with second through-hole H2. In the plan view and the bottom view, the shape of main body 21 is an annular ring shape. Second through-hole H2 is a hole penetrating through main body 21 in the thickness direction of fluorescent substrate 10 (the z-axis direction), and has a circular shape in the plan view. The center of the annular ring shape that is the shape of main body 21 overlaps center point C1 of fluorescent substrate 10.

The outside diameter of main body 21 is smaller than the outside diameter of fluorescent substrate 10. Note that here, the outside diameter of main body 21 means the diameter of first principal surface 211 of main body 21. The outside diameter of main body 21 is preferably in a range from 20 mm to 70 mm, more preferably in a range from 25 mm to 55 mm, and yet more preferably in a range from 30 mm to 40 mm, but the outside diameter is not limited thereto. Note that in the present embodiment, the outside diameter of main body 21 is 34 mm, and thus the radius of main body 21 is 17 mm.

It is sufficient if the inside diameter of main body 21 is smaller than the outside diameter of main body 21. The inside diameter of main body 21 is the same as the inside diameter of fluorescent substrate 10 herein, but is not limited thereto. The inside diameter of main body 21 is the diameter of second through-hole H2.

In the present embodiment, as illustrated in FIG. 2 and FIG. 3, at least a portion of first through-hole H1 and at least a portion of second through-hole H2 overlap in the plan view and the bottom view. More specifically, in the plan view, the entirety of first through-hole H1 and the entirety of second through-hole H2 overlap. Thus, the diameter of first through-hole H1 (the inside diameter of fluorescent substrate 10) is the same as the diameter of second through-hole H2 (the inside diameter of main body 21). Furthermore, in the plan view and the bottom view, the center of the circular shape of first through-hole H1 and the center of the circular shape of second through-hole H2 overlap center point C1 of fluorescent substrate 10.

Transmissive fluorescence emitting module 1 according to the present embodiment includes fluorescent substrate 10 and metal member 20. Metal member 20 is bonded to third principal surface 11 of fluorescent substrate 10. Accordingly, even when heat is generated in fluorescent substrate 10 due to being irradiated with excitation light L1, the heat is readily transferred from fluorescent substrate 10 to metal member 20. In general, the metal material of metal member 20 has higher thermal conductivity than that of a fluorescent material such as YAG. Accordingly, the heat is readily transferred inside metal member 20, and readily dissipated from the surface of metal member 20 exposed to the atmosphere. Thus, since fluorescent substrate 10 and metal member 20 are configured as above, such heat is readily dissipated from fluorescent substrate 10. Accordingly, heat dissipation of fluorescent substrate 10 can be enhanced.

Here, advantageous effects yielded by transmissive fluorescence emitting module 1 according to the present embodiment are to be described.

As described above, if a thermal quenching phenomenon occurs in the transmissive fluorescence emitting module disclosed in PTL 1, efficiency of light usage decreases. However, in the present embodiment, the heat is readily dissipated from fluorescent substrate 10, and thus a rise in temperature of fluorescent substrate 10 due to being irradiated with excitation light L1 can be reduced. Accordingly, a thermal quenching phenomenon does not readily occur, and thus a decrease in fluorescence can be reduced.

Furthermore, transmissive fluorescence emitting module 1 according to the present embodiment does not include, for instance, an element for supporting fluorescent substrate 10. An example of such an element is a substrate for fluorescence disclosed in PTL 1. The substrate for fluorescence is made of a plate-shaped glass member that supports the fluorescence generator, for instance.

Here, behavior of light disclosed in PTL 1 is to be described. PTL 1 discloses that excitation light enters the substrate for fluorescence from the atmosphere. Furthermore, the excitation light that has entered the substrate for fluorescence passes through the substrate for fluorescence and enters the fluorescence generator, so that fluorescence is generated by the fluorescence generator. By the way, in PTL 1, a portion of excitation light that enters the substrate for fluorescence from the atmosphere is reflected toward the atmosphere, due to a difference between the index of refraction of the substrate for fluorescence and the index of refraction of the atmosphere. Thus, loss of excitation light occurs at the interface between the substrate for fluorescence and the atmosphere. As a result, as compared with the case where a portion of excitation light is not reflected, excitation light that enters the fluorescence generator decreases, and thus fluorescence generated in the fluorescence generator also decreases. Consequently, the transmissive fluorescence emitting module disclosed in PTL 1 has a problem that efficiency of light usage is low.

In contrast, in the present embodiment, as described above, transmissive fluorescence emitting module 1 according to the present embodiment does not include an element for supporting fluorescent substrate 10 (for example, the above substrate for fluorescence). Accordingly, loss of excitation light L1 as stated above does not occur, and thus excitation light L1 that enters fluorescent substrate 10 increases. As a result, fluorescence generated by the fluorescent material included in fluorescent substrate 10 increases.

To summarize the above, in transmissive fluorescence emitting module 1 according to the present embodiment, a thermal quenching phenomenon does not readily occur and loss of excitation light L1 does not occur, and thus efficiency of light usage can be increased.

In the present embodiment, metal member 20 includes main body 21.

Since main body 21 has the above configuration, the area in which fluorescent substrate 10 and metal member 20 (here, main body 21) are bonded to each other further increases. Accordingly, even when heat is generated in fluorescent substrate 10 due to being irradiated with excitation light L1, the heat is more readily dissipated from fluorescent substrate 10.

Here, thickness D21 of main body 21 is to be described with reference to FIG. 4.

Figure 4:
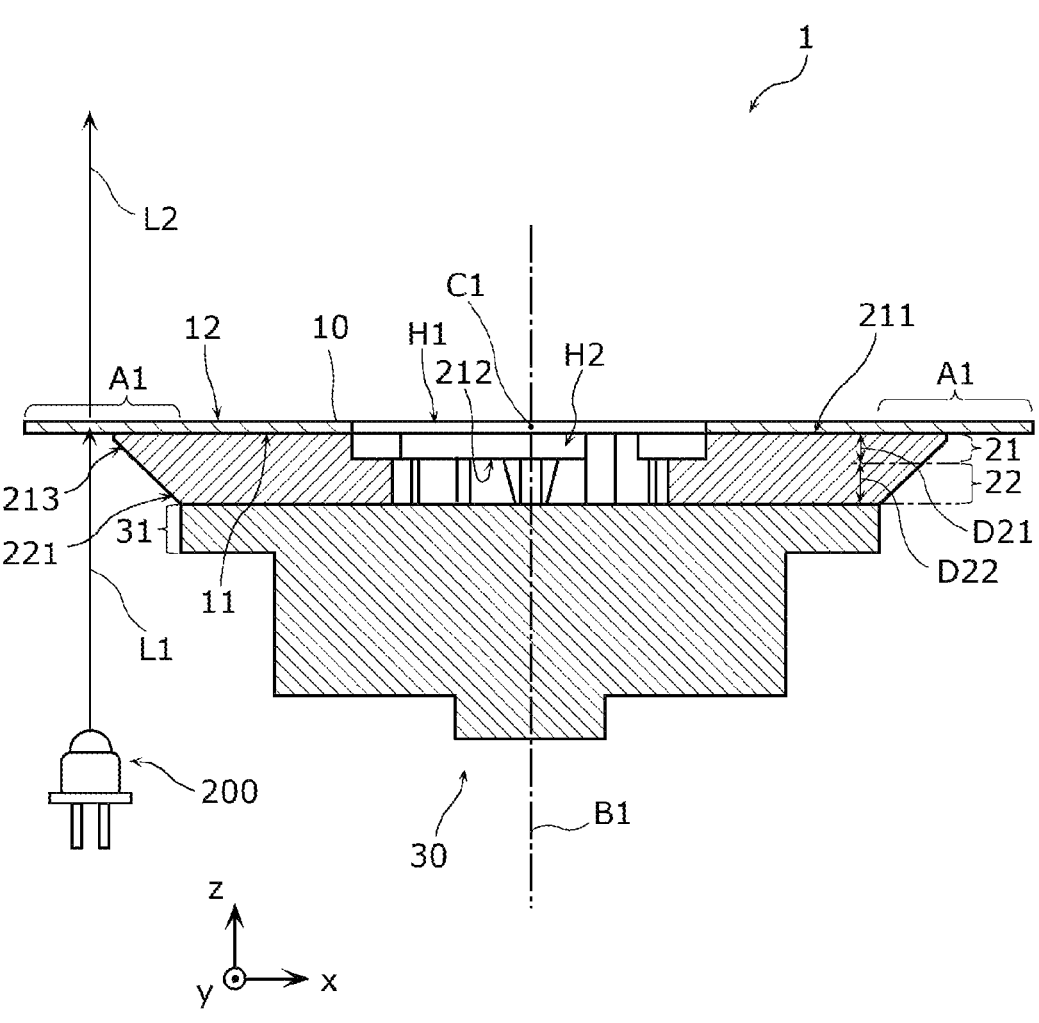
FIG. 4 is a cross sectional view illustrating a cut surface of a portion of the transmissive fluorescence emitting module, which is taken along line IV-IV in FIG. 1A.

FIG. 4 is a cross sectional view illustrating a cut surface of a portion of transmissive fluorescence emitting module 1, which is taken along line IV-IV in FIG. 1A. Note that FIG. 4 shows a side view of light emitter 200.

Thickness D21 of main body 21 (the length in the z-axis direction) is desirably greater than the thickness of fluorescent substrate 10. The reason is that this improves heat conductivity. On the other hand, if the thickness of fluorescent substrate 10 excessively increases, a load applied onto rotator 30 that is a motor increases, and the life thereof shortens. Thus, thickness D21 of main body 21 is preferably in a range from 0.2 mm to 50 mm, more preferably in a range from 0.5 mm to 10 mm, and yet more preferably in a range from 1 mm to 5 mm, as examples. The greater thickness D21 of main body 21 is, the more readily the heat is dissipated from fluorescent substrate 10. On the other hand, the smaller thickness D21 of main body 21 is, the less the volume of main body 21 is, or stated differently, the less the weight of main body 21 is. Accordingly, rotator 30 can rotate fluorescent substrate 10, for instance, using less energy. Thus, thickness D21 of main body 21 is preferably in the above ranges.

Furthermore, radiator fins 22 that metal member 20 includes are to be described.

Radiator fins 22 are projections that protrude in a direction opposite the direction from main body 21 to fluorescent substrate 10. Thus, radiator fins 22 are regions in contact with main body 21 and protrude in the negative z-axis direction. FIG. 4 illustrates thickness D22 of radiator fins 22. Note that radiator fins 22 have same thickness D22, but may have different thicknesses. Thickness D22 may be greater than thickness D21 of main body 21. Thickness D22 is preferably in a range from 1 mm to 150 mm, more preferably in a range from 2 mm to 30 mm, and yet more preferably in a range from 3 mm to 10 mm, as examples.

Note that the greater thickness D22 is, the more heat dissipation effects can be enhanced. On the other hand, if thickness D22 increases, the weight increases, so that a load applied onto rotator 30 that is a motor increases. In order to maintain rigidity against rotation, radiator fins 22 need to have a great thickness in the circumference direction. If the thickness of radiator fins 22 decreases, conductivity of heat from main body 21 decreases, and as a result, heat dissipation performance deteriorates. The thickness of radiator fins 22 in the circumference direction is preferably in a range from 0.2 mm to 3 mm, and more preferably in a range from 0.4 mm to 2 mm, when thickness D22 is 5 mm. Note that the thickness in the circumference direction may vary, and the above ranges show average values of thicknesses other than portions that are thick due to the influence of screws, for instance.

As illustrated in FIG. 1A, FIG. 1B, FIG. 2, and FIG. 3, here, twelve radiator fins 22 are provided. In the plan view, twelve radiator fins 22 radially extend. More specifically, twelve radiator fins 22 extend radially about axis B1. Thus, twelve radiator fins 22 form a shape extending radially about center point C1 of fluorescent substrate 10. Twelve radiator fins 22 extend radially about center point C1, spreading at equal intervals.

For example, when n radiator fins 22 are provided, "spreading at equal intervals" means that an angle formed by the direction in which one radiator fin 22 extends and the direction in which another radiator fin 22 that is adjacent to one radiator fin 22 extends is an angle obtained by dividing 360 degrees by n. FIG. 2 shows direction D1 in which one radiator fin 22 extends and direction D2 in which another radiator fin 22 adjacent to one radiator fin 22 extends, with the dash-dot lines. In the present embodiment, out of twelve radiator fins 22, an angle formed by direction D1 in which one radiator fin 22 extends and direction D2 in which another radiator fin 22 extends is 30 degrees.

Note that here, twelve radiator fins 22 are provided, yet the present embodiment is not limited thereto and it is sufficient if at least one radiator fin 22 is provided. Radiator fins 22 may be disposed, for example, in a matrix shape or an annular ring shape about center point C1, rather than being limited to the above.

Furthermore, as illustrated in FIG. 3, in the bottom view, radiator fins 22 each include a region projecting toward center point C1. The projecting regions included in radiator fins 22 project inward beyond the inner circle of main body 21 and provided at positions that overlap second through-hole H2. In the present embodiment, the entirety of first through-hole H1 and the entirety of second through-hole H2 overlap, and thus the projecting regions included in radiator fins 22 are provided at positions that overlap first through-hole H1 and second through-hole H2.

As illustrated in FIG. 2 and FIG. 4, radiator fins 22 each include second side surface 221 at a position most distant from axis B1. Second side surfaces 221 of radiator fins 22 are slanting surfaces that spread in the positive z-axis direction. Second side surfaces 221 that are slanting surfaces are not parallel to the z axis. Furthermore, second side surfaces 221 and first side surface 213 of main body 21 are connected flush with each another. Second side surfaces 221 and first side surface 213 are parallel to one another at connected portions.

Since metal member 20 includes radiator fins 22, the surface area of metal member 20 increases, so that heat is more readily dissipated from metal member 20. Accordingly, heat generated in fluorescent substrate 10 due to being irradiated with excitation light L1 is more readily dissipated from fluorescent substrate 10.

In the present embodiment, metal member 20 consists essentially of Al. Al is a metal material having high thermal conductivity, which is 237 W/m·K. The thermal conductivity of YAG included in the fluorescent material is 11.2 W/m·K. Accordingly, since metal member 20 consists essentially of Al, heat dissipation of fluorescent substrate 10 can be further increased.

Note that metal member 20 may consist essentially of a material other than Al and Cu, and may consist essentially of one or more metal elements selected from among Ni, Pd, Rh, Mo, W, and Cu or an alloy that includes one or more of the metal elements, for example. The elements have thermal conductivity as follows: thermal conductivity of Ni is 83 W/m·K, thermal conductivity of Pd is 73 W/m·K, thermal conductivity of Rh is 150 W/m·K, thermal conductivity of Mo is 135 W/m·K, thermal conductivity of W is 163 W/m·K, and thermal conductivity of Cu is 395 W/m·K. Accordingly, heat dissipation of wavelength conversion member 10 can be further increased by making metal member 20 using such a metal material.

Next, rotator 30 is to be described.

Rotator 30 is located on the z-axis negative side with respect to metal member 20. Thus, metal member 20 is located between rotator 30 and fluorescent substrate 10. Here, rotator 30 is bonded to metal member 20. As illustrated in FIG. 2, rotator 30 is provided at a position that overlaps fluorescent substrate 10, in the plan view.

Rotator 30 is a member that rotates fluorescent substrate 10 and metal member 20 about axis B1 that extends in the thickness direction (z-axis direction) of fluorescent substrate 10, and is a motor as an example. More specifically, in the present embodiment, rotator 30 rotates fluorescent substrate 10 and metal member 20 about axis B1 in the direction indicated by arrow R illustrated in FIG. 1A. Note that rotator 30 may rotate fluorescent substrate 10 and metal member 20 in the direction opposite the direction indicated by arrow R illustrated in FIG. 1A. As illustrated in FIG. 1B, axis B1 passes through center point C1 of fluorescent substrate 10.

Further, rotator 30 includes disc 31 and a rotation shaft having a center along axis B1. Disc 31 is a plate-shaped member having a circular shape in the plan view, as illustrated in FIG. 2. The diameter of disc 31 is the same as the diameter of main body 21 that metal member 20 includes.

As described above, rotator 30 is bonded to metal member 20. More specifically, disc 31 is bonded to radiator fins 22 that metal member 20 includes. As illustrated in FIG. 2, disc 31 covers metal member 20 on the z-axis negative side.

Disc 31 and radiator fins 22 may be bonded to each other using bolts or screws, for instance. In the present embodiment, disc 31 is bonded to radiator fins 22 with a bonding layer being provided therebetween. In this case, as an example of the bonding layer, a bonding layer same as the bonding layer that bonds metal member 20 and fluorescent substrate 10 to each other is used.

As stated above, transmissive fluorescence emitting module 1 according to the present embodiment includes rotator 30. In this manner, fluorescent substrate 10, for instance, rotates about axis B1, thus generating air currents. Fluorescent substrate 10 is cooled by the generated air currents. Accordingly, a rise in temperature of fluorescent substrate 10 can be reduced even when fluorescent substrate 10 is irradiated with excitation light L1, and thus a thermal quenching phenomenon does not readily occur and a decrease in fluorescence is reduced. Thus, efficiency of light usage achieved by transmissive fluorescence emitting module 1 can be increased.

As described above, in the present embodiment, radiator fins 22 that metal member 20 includes extend radially. Thus, when fluorescent substrate 10, for instance, is rotated by rotator 30, air currents having a higher flow velocity are generated.

Furthermore, in the present embodiment, first through-hole H1 and second through-hole H2 overlap each other. Accordingly, when fluorescent substrate 10, for instance, is rotated by rotator 30, air currents having a still higher flow velocity are generated.

FIG. 1A illustrates examples of such air currents using arrows shown by the dash-dot lines. Thus, the air currents pass through first through-hole H1, second through-hole H2, and spaces between radiator fins 22 in this order and travel toward region A1 that fluorescent substrate 10 includes. Accordingly, since heat generated in region A1 by being irradiated with excitation light L1 is cooled by the air currents, a rise in temperature of fluorescent substrate 10 can be reduced. Thus, since radiator fins 22 included in metal member 20 extend radially, heat dissipation of transmissive fluorescence emitting module 1 can be further enhanced. Furthermore, since first through-hole H1 and second through-hole H2 overlap each other, air currents having a still higher flow velocity are generated. Accordingly, a rise in temperature of fluorescent substrate 10 can be further reduced.

As described above, radiator fins 22 each include a region projecting toward center point C1. Accordingly, the air currents readily pass through first through-hole H1, second through-hole H2, and spaces between radiator fins 22. Hence, air currents having a yet higher flow velocity are generated, and a rise in temperature of fluorescent substrate 10 can be further reduced.

Here, in the present embodiment, disc 31 covers metal member 20. Accordingly, air currents generated when fluorescent substrate 10, for instance, is rotated by rotator 30 readily travel toward region A1, and a rise in temperature of fluorescent substrate 10 can be further reduced.

In the present embodiment, radiator fins 22 are provided between main body 21 and disc 31. In this case, space is provided between one radiator fin 22 and another radiator fin 22 adjacent to one radiator fin 22. Thus, the provided space contributes to reduction in weight of metal member 20. Accordingly, rotator 30 can rotate fluorescent substrate 10 and metal member 20 using less energy.

[Configuration of Projector]

Figure 5:
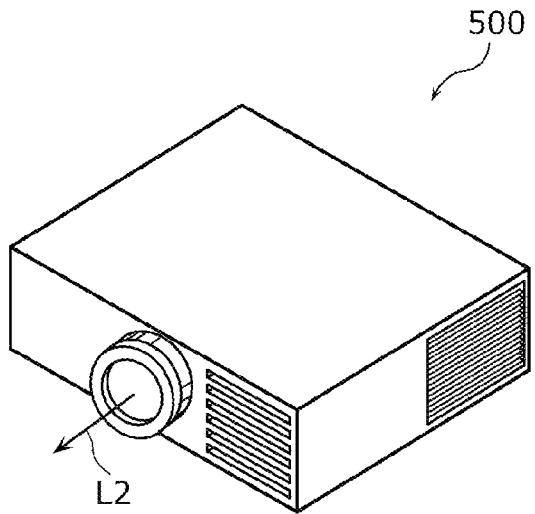
FIG. 5 is a perspective view illustrating an appearance of a projector according to the embodiment.
Figure 6:
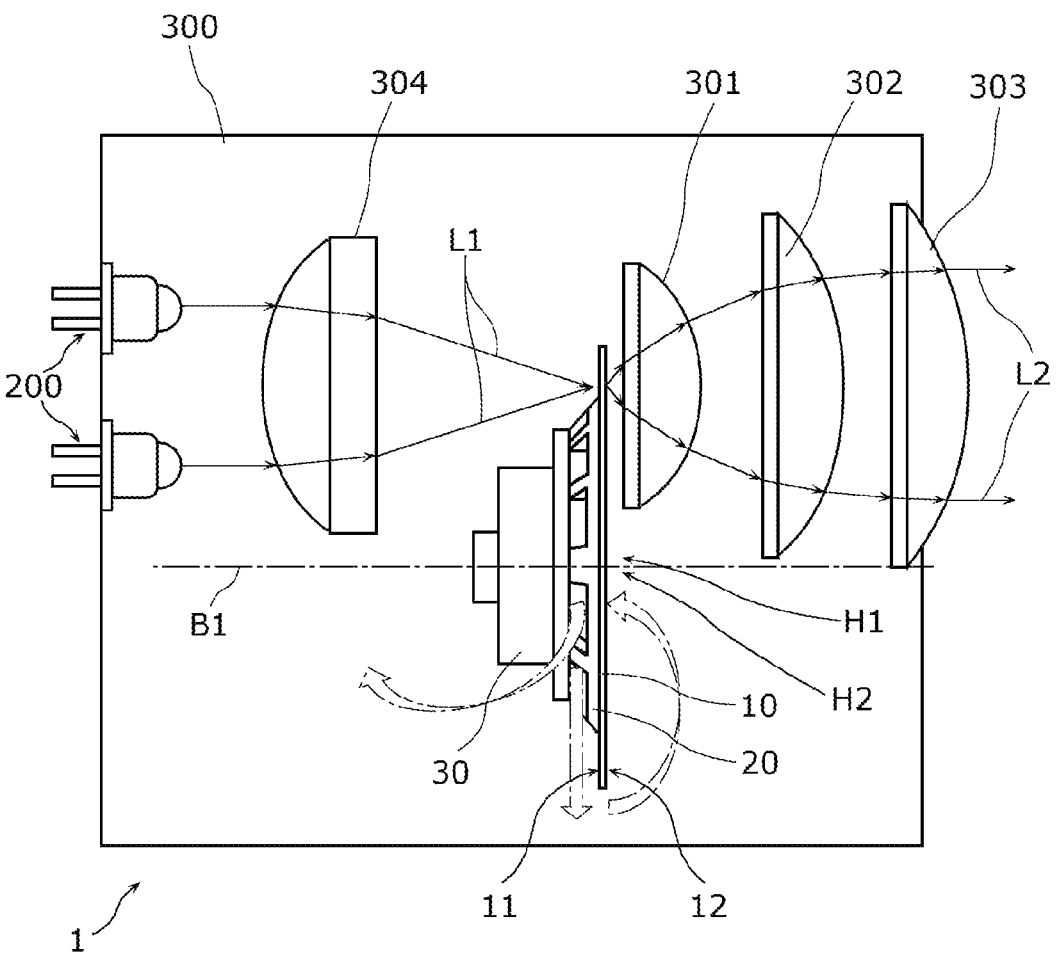
FIG. 6 is a schematic diagram illustrating the transmissive fluorescence emitting module in the projector according to the embodiment.

Transmissive fluorescence emitting module 1 having a configuration as described above is used in projector 500 illustrated in FIG. 5. FIG. 5 is a perspective view illustrating an appearance of projector 500 according to the present embodiment. FIG. 6 is a schematic diagram illustrating transmissive fluorescence emitting module 1 in projector 500 according to the present embodiment. In the following, a configuration of projector 500 according to the present embodiment is to be described with reference to FIG. 6.

As illustrated in FIG. 6, projector 500 according to the present embodiment includes transmissive fluorescence emitting module 1. Projector 500 includes casing 300, first optical element 301, second optical element 302, third optical element 303, fourth optical element 304, and a display element (not illustrated).

Casing 300 is a metal case that stores therein fluorescent substrate 10, metal member 20, rotator 30, first optical element 301, second optical element 302, and fourth optical element 304. Note that casing 300 stores therein a portion of each of two light emitters 200 and a portion of third optical element 303. The inner space of casing 300 is a closed space. Thus, fluorescent substrate 10, metal member 20, rotator 30, first optical element 301, second optical element 302, and fourth optical element 304 are protected by casing 300, and are less likely to be polluted by dust or dirt, for instance.

First optical element 301, second optical element 302, and third optical element 303 are optical members that control optical paths of transmitted light L2 output from transmissive fluorescence emitting module 1. As an example, first optical element 301, second optical element 302, and third optical element 303 are lenses that collect transmitted light L2. As illustrated in FIG. 6, first optical element 301, second optical element 302, and third optical element 303 are disposed closer to fourth principal surface 12 of fluorescent substrate 10 than to third principal surface 11. If the size of projector 500 needs to be decreased, the distances from transmissive fluorescence emitting module 1 to first optical element 301, second optical element 302, and third optical element 303 need to be shortened.

Fourth optical element 304 is an optical member that controls optical paths of excitation light L1 output from two light emitters 200. As an example, fourth optical element 304 is a lens for collecting excitation light L1. As illustrated in FIG. 6, fourth optical element 304 is disposed closer to third principal surface 11 of fluorescent substrate 10 than to fourth principal surface 12. As illustrated in FIG. 6, since excitation light L1 is collected by fourth optical element 304, excitation light L1 enters fluorescent substrate 10 also in a slanting direction (that is, a direction different from a direction vertical to third principal surface 11).

The display element is a substantially planar element that controls and outputs transmitted light L2 as a video. In other words, the display element generates light for a video. The display element is specifically a transmissive liquid crystal panel. For example, the display element may be a reflective liquid crystal panel or may be a digital light processing (DLP) panel that includes a digital micromirror device (DMD).

Next, behavior of light in FIG. 6 is to be described.

Excitation light L1 emitted by light emitters 200 enters region A1 included in fluorescent substrate 10 in transmissive fluorescence emitting module 1. A wavelength of a portion of excitation light L1 that has entered is converted by the fluorescent material included in region A1, and the portion of excitation light L1 passes through fluorescent substrate 10 in the form of fluorescence. A wavelength of another portion of excitation light L1 that has entered is not converted by the fluorescent material included in region A1, and the other portion of excitation light L1 passes through fluorescent substrate 10. Transmitted light L2 passing through fluorescent substrate 10 is combined light that includes fluorescence that is yellow light and excitation light L1 that is blue light having a wavelength not converted, and is white light. Furthermore, transmitted light L2 exits through fluorescent substrate 10. Thus, as described above, fluorescent substrate 10 is used as a light-transmissive fluorescent wheel, in the present embodiment.

As described above, since the shape of region A1 is an annular ring shape, when fluorescent substrate 10, for instance, is rotated by rotator 30, excitation light L1 readily enters region A1. Accordingly, fluorescent substrate 10 can be more readily used as a fluorescent wheel.

Transmitted light L2 that has exited through fluorescent substrate 10 is collected by first optical element 301, second optical element 302, and third optical element 303, and exits therethrough. Note that first optical element 301, second optical element 302, and third optical element 303 may not collect transmitted light L2 that has exited through fluorescent substrate 10. For example, first optical element 301, second optical element 302, and third optical element 303 may substantially collimate transmitted light L2 that has exited or cause transmitted light L2 that has exited to slightly spread out. An angle of radiation of transmitted light L2 exiting through first optical element 301, second optical element 302, and third optical element 303 may be an angle of radiation at which light efficiently travels in projector 500 and an illumination device in each of which transmissive fluorescence emitting module 1 is used.

Transmitted light L2 that has exited through first optical element 301, second optical element 302, and third optical element 303 travels toward the display element that is not illustrated. Light for a video generated by the display element is projection light that is to be enlarged and projected onto a screen. Thus, transmitted light L2 is used as projection light output by projector 500. Note that an optical element not illustrated, for instance, is provided between third optical element 303 and the display element, and the optical paths of transmitted light L2 may be controlled by the optical element.

In the present embodiment, transmissive fluorescence emitting module 1 includes light emitters 200 that each emit excitation light L1 that is to enter region A1. Region A1 is a region of fluorescent substrate 10, which does not overlap metal member 20. Thus, loss of light such as reflection of excitation light L1 by metal member 20 is less likely to occur. Accordingly, excitation light L1 readily enters fluorescent substrate 10, and generates fluorescence that is light having a converted wavelength.

In the present embodiment, the shape of main body 21 is circular in the plan view. With regard to first principal surface 211 and second principal surface 212 on opposite sides from each other, the area of first principal surface 211 is greater than the area of second principal surface 212. Thus, the shape of main body 21 is a truncated cone shape. As described above, excitation light L1 enters region A1 of fluorescent substrate 10 in a slanting direction. Thus, since main body 21 has the above configuration, excitation light L1 is less likely to be blocked by metal member 20. Thus, loss of excitation light L1 due to being blocked by metal member 20 can be reduced. Thus, excitation light L1 readily reaches region A1 of fluorescent substrate 10. As described above, transmissive fluorescence emitting module 1 that achieves higher efficiency of light usage can be produced.

In the present embodiment, projector 500 includes transmissive fluorescence emitting module 1 that achieves high efficiency of light usage. Accordingly, projector 500 that achieves high efficiency of light usage can be produced.

The inner space of casing 300 is a closed space in order to reduce pollution due to dust and dirt, for instance, and thus heat is not readily dissipated. In the present embodiment, first through-hole H1 and second through-hole H2 are provided. Thus, air currents generated when fluorescent substrate 10, for instance, is rotated by rotator 30 travel from the third principal surface 11 side toward the fourth principal surface 12 side. Accordingly, air currents circulate in the entire inner space of casing 300, and thus heat generated in fluorescent substrate 10 due to being irradiated with excitation light L1 is readily transferred from casing 300 to the outside. Hence, the heat is more readily dissipated from fluorescent substrate 10.

Furthermore, casing 300 is to be described in more detail.

Figure 7:
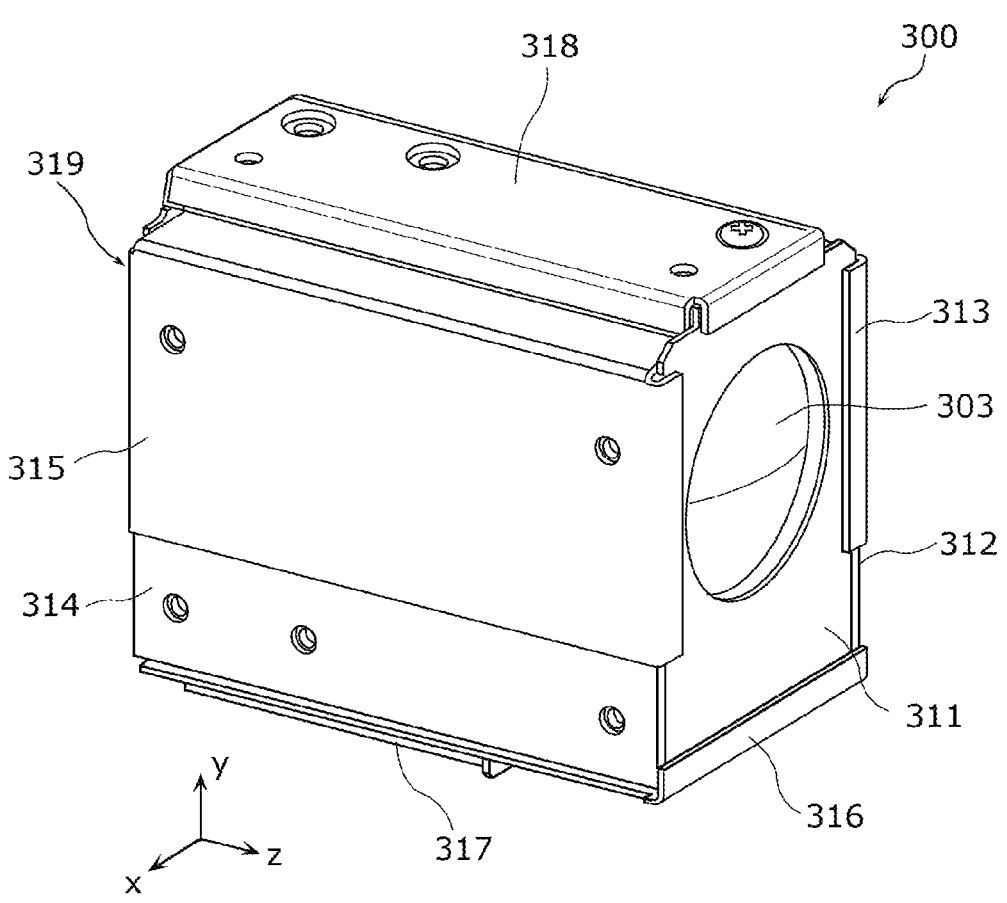
FIG. 7 is a perspective view illustrating a casing according to the embodiment.

FIG. 7 is a perspective view illustrating casing 300 according to the present embodiment. As illustrated in FIG. 7, casing 300 includes nine elements. The nine elements are front surface member 311, first left surface member 312, second left surface member 313, first right surface member 314, second right surface member 315, first bottom surface member 316, second bottom surface member 317, top surface member 318, and back surface member 319. Casing 300 includes connecting members (such as screws) for connecting the nine elements to one another.

The nine elements are formed by processing metal plates such as steel plates, for example. Thus, the nine elements are formed by cutting or bending such metal plates. Casing 300 is a case obtained by combining such nine elements. Since the nine elements included in casing 300 each formed of a processed metal plate, the weight of casing 300 can be made lighter than a casing having a die-cast structure, for example.

[Manufacturing Method]

Here, a method for manufacturing fluorescent substrate 10 is to be briefly described.

A fluorescent material included in fluorescent substrate 10 consists essentially of a crystalline phase represented by $(Y_{0.999}Ce_{0.001})_3Al_5O_{12}$. Further, the fluorescent material consists essentially of a $Ce^{3+}$ active fluorescence substance.

The following three raw materials are used as powdered chemical compounds to manufacture fluorescent substrate 10. Specifically, $Y_2O_3$ (purity 3N, Nippon Yttrium Co., Ltd.), $Al_2O_3$ (purity 3N, Sumitomo Chemical Co., Ltd.), and $CeO_2$ (purity 3N, Nippon Yttrium Co., Ltd.) are used.

First, the raw materials are weighted to obtain a chemical compound of stoichiometry $(Y_{0.999}Ce_{0.001})_3Al_5O_{12}$. Next, the weighted raw materials and alumina balls (having a diameter of 10 mm) are put into a plastic pot. The amount of alumina balls is sufficient to fill about ⅓ of the volume of the plastic pot. After that, pure water is put into the plastic pot, and the raw materials and the pure water are mixed using a pot rotator (manufactured by Nitto Kagaku Co., Ltd., BALL MILL ANZ-51S). The raw materials and the pure water are mixed for 12 hours. Accordingly, a slurried mixed raw material is obtained.

The slurried mixed raw material is dried using a drier. Specifically, a NAFLON® sheet is placed so as to cover the inner walls of a metal vat, and the mixed raw material is poured onto the NAFLON® sheet. The metal vat, the NAFLON® sheet, and the mixed raw material are processed for eight hours in the drier that is set to 150 degrees Celsius and dried. After that, the dried mixed raw material is collected, and granulated using a spray dryer device. Note that when the raw material is granulated, an acrylic binder is used as an adhesive (a binder).

The granulated mixed raw material is temporarily molded into a cylinder using an electric hydraulic press (manufactured by Riken Seiki Co., Ltd., EMP-5) and a cylindrical metal mold. The pressure applied when the raw material is molded is set to 5 MPa. Next, the temporarily molded raw material is firmly molded using a cold isostatic press. The pressure applied when the raw material is firmly molded is set to 300 MPa. Note that the raw material firmly molded is subjected to heat treatment (binder removal treatment) in order to remove the adhesive (binder) used when the raw material is granulated. The temperature for the heat treatment is set to 500 degrees Celsius. Furthermore, the time for the heat treatment is set to 10 hours.

The molded raw material subjected to the heat treatment is baked using a tube atmospheric furnace. The baking temperature is set to 1675 degrees Celsius. The baking time is set to 4 hours. The baking atmosphere is a mixed gas atmosphere of nitrogen and hydrogen.

The cylindrical baked product is sliced using a multi-wire saw. The thickness of the sliced cylindrical baked product is about 700 μm.

The sliced baked product is ground using a grinding device to adjust the thickness of the baked product. By making this adjustment, the baked product becomes fluorescent substrate 10.

[Temperature of Fluorescent Substrate]

Here, the temperature of fluorescent substrate 10 in transmissive fluorescence emitting module 1 according to the present embodiment is to be described using a transmissive fluorescence emitting module according to an example to be considered. First, a transmissive fluorescence emitting module according to an example to be considered is to be described.

Figure 8:
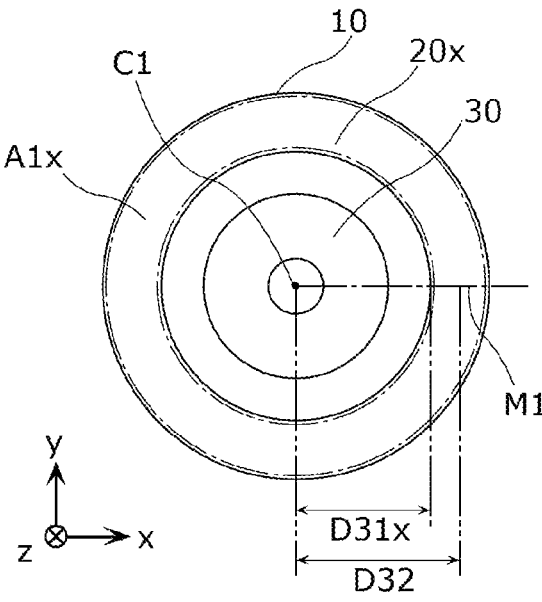
FIG. 8 is a plan view of a fluorescent substrate, a metal member, and a rotator that are included in a transmissive fluorescence emitting module according to an example to be considered.
Figure 9:
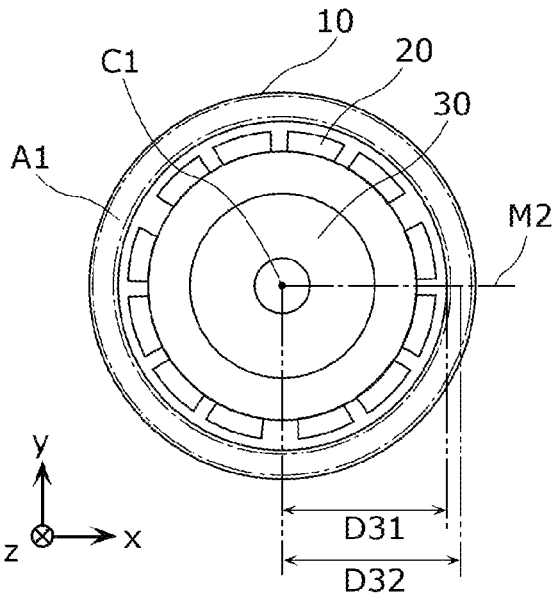
FIG. 9 is a plan view of the fluorescent substrate, the metal member, and the rotator according to the embodiment.
Figure 10:
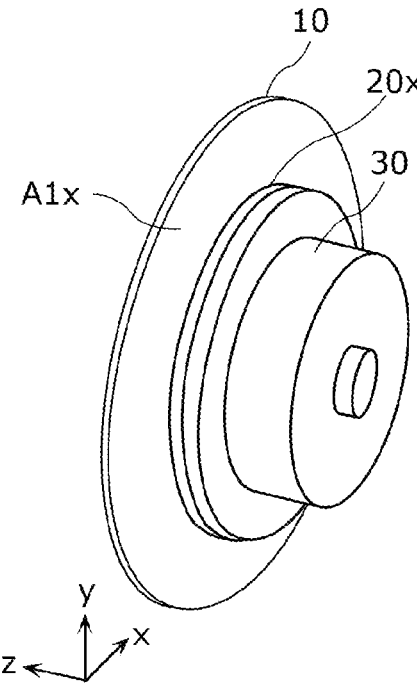
FIG. 10 is a perspective view of the fluorescent substrate, the metal member, and the rotator that are included in the transmissive fluorescence emitting module according to the example to be considered.
Figure 11:
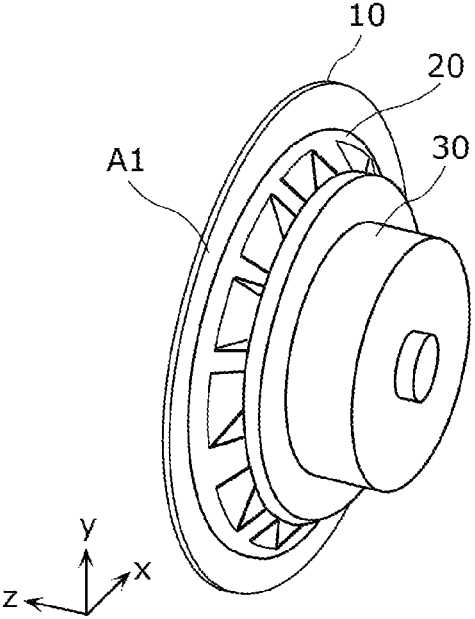
FIG. 11 is a perspective view of the fluorescent substrate, the metal member, and the rotator according to the embodiment.

FIG. 8 is a plan view of fluorescent substrate 10, metal member 20x, and rotator 30 that are included in the transmissive fluorescence emitting module according to the example to be considered. FIG. 9 is a plan view of fluorescent substrate 10, metal member 20, and rotator 30 according to the present embodiment. FIG. 10 is a perspective view of fluorescent substrate 10, metal member 20x, and rotator 30 that are included in the transmissive fluorescence emitting module according to the example to be considered. FIG. 11 is a perspective view of fluorescent substrate 10, metal member 20, and rotator 30 according to the present embodiment.

As illustrated in FIG. 8 and FIG. 10, the transmissive fluorescence emitting module according to the example to be considered includes fluorescent substrate 10, metal member 20x, and rotator 30. The transmissive fluorescence emitting module according to the example to be considered includes two light emitters 200 (not illustrated). The transmissive fluorescence emitting module according to the example to be considered is different from transmissive fluorescence emitting module 1 according to the present embodiment in the shape of metal member 20x only.

Here, metal member 20x is to be described.

Metal member 20x has a similar configuration to that of metal member 20 except its shape. Metal member 20x is a plate-shaped member stacked over fluorescent substrate 10. More specifically, as illustrated in FIG. 8 and FIG. 10, the shape of metal member 20x is a cylindrical shape.

As illustrated in FIG. 8, FIG. 9, FIG. 10, and FIG. 11, the outside diameter of metal member 20 (here, the outside diameter of main body 21) is greater than the outside diameter of metal member 20x. The outside diameter of metal member 20x means the diameter of metal member 20x.

The outside diameter (diameter) of metal member 20x is 28 mm. Further, FIG. 8 illustrates radius D31x of metal member 20x, and radius D31x of metal member 20x is 14 mm.

Note that similarly, FIG. 9 illustrates radius D31 of main body 21. As described above, radius D31 of main body 21 is 17 mm.

Fluorescent substrate 10 according to the example to be considered includes annular ring-shaped region A1x that does not overlap metal member 20x in the plan view. Note that region A1x and region A1 correspond to regions between two circles indicated by the dash-dot lines in FIG. 8 and FIG. 9, respectively.

In the present embodiment, main body 21 and region A1 are adjacent to each other in the plan view of fluorescent substrate 10. Here, the inner circle of annular ring-shaped region A1 is in contact with main body 21 (more specifically, first principal surface 211).

Similarly, in the example to be considered, metal member 20x and region A1 are adjacent to each other in the plan view of fluorescent substrate 10. The inner circle of annular ring-shaped region A1x is in contact with metal member 20x.

Furthermore, the temperature of fluorescent substrate 10 is to be described. Here, a temperature of fluorescent substrate 10 when rotator 30 rotates fluorescent substrate 10 and metal member 20x/20 and region A1x/A1 is irradiated with excitation light L1 is to be described. More specifically, excitation light L1 is emitted onto an irradiation center position in region A1x/A1. FIG. 8 and FIG. 9 illustrate irradiation center position distance D32 that is a distance between center point C1 and the irradiation center position of excitation light L1, and irradiation center position distance D32 is 18 mm.

Figure 12:
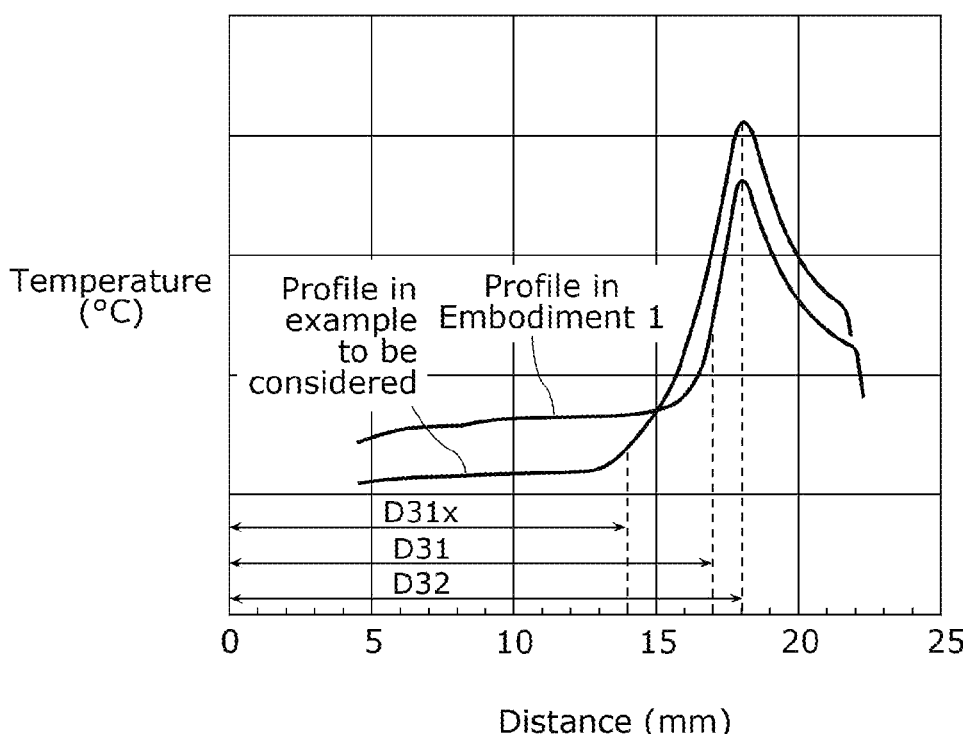
FIG. 12 illustrates temperature profiles of the fluorescent substrates according to the example to be considered and the embodiment.

FIG. 12 illustrates temperature profiles of fluorescent substrates 10 according to the example to be considered and the present embodiment. More specifically, the temperature profile of fluorescent substrate 10 according to the example to be considered shows a temperature measured along measurement line M1 illustrated in FIG. 8. Similarly, the temperature profile of fluorescent substrate 10 according to the present embodiment shows a temperature measured along measurement line M2 illustrated in FIG. 9. Measurement line M1 and measurement line M2 are virtual straight lines parallel to the x axis. A position at a distance of 0 mm in FIG. 12 corresponds to center point C1 in FIG. 8 and FIG. 9.

As illustrated in FIG. 12, in the example to be considered, a temperature at a distance of 18 mm that is the irradiation center position of excitation light L1 (specifically, a position distant from a distance of 0 mm by irradiation center position distance D32) is the highest among the temperatures at other positions. In the present embodiment, a similar tendency is exhibited.

However, a comparison between the example to be considered and the present embodiment shows that the temperature in the present embodiment is lower than the temperature in the example to be considered at the irradiation center position of excitation light L1.

As described above, radius D31 of main body 21 is longer than radius D31x of metal member 20x. Thus, main body 21 is provided at a position closer to the irradiation center position of excitation light L1 than metal member 20x is thereto. Accordingly, even when heat is generated in fluorescent substrate 10 due to being irradiated with excitation light L1, the heat is readily transferred from fluorescent substrate 10 to main body 21 (that is, metal member 20). Thus, in the present embodiment, heat dissipation of fluorescent substrate 10 can be further enhanced.

To summarize the above, in the present embodiment, main body 21 and region A1 are adjacent to each other in the plan view of fluorescent substrate 10. Furthermore, radius D31 of main body 21 may be shorter than irradiation center position distance D32, and main body 21 may be provided at a position closer to the irradiation center position of excitation light L1. For example, a difference between radius D31 of main body 21 and irradiation center position distance D32 is preferably 3 mm or less, more preferably 2 mm or less, and yet more preferably 1 mm or less.

Accordingly, heat generated by being irradiated with excitation light L1 is readily transferred from fluorescent substrate 10 to main body 21 (that is, metal member 20), and thus heat dissipation of fluorescent substrate 10 can be further enhanced.

Variation 1 of Embodiment

Figure 13A:
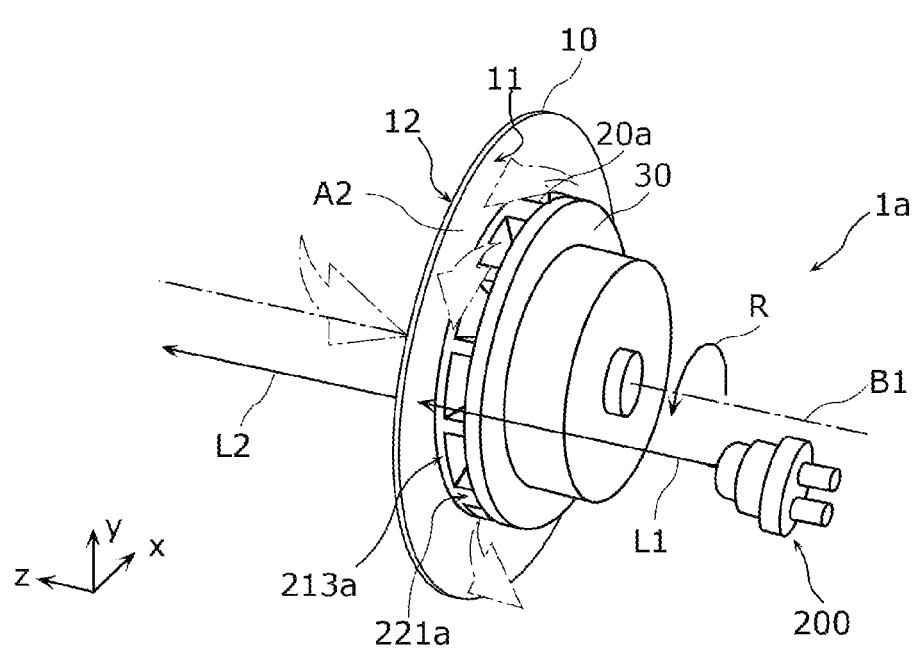
FIG. 13A is a perspective view of a transmissive fluorescence emitting module according to Variation 1 of the embodiment.
Figure 13B:
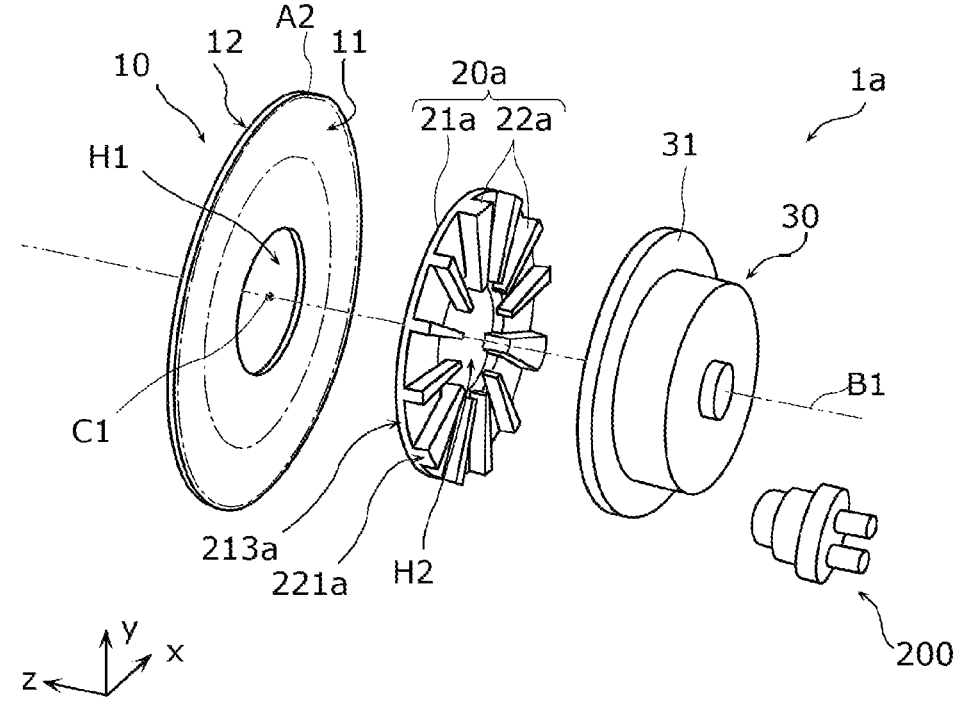
FIG. 13B is an exploded perspective view of the transmissive fluorescence emitting module according to Variation 1 of the embodiment.

Next, transmissive fluorescence emitting module 1*a* according to Variation 1 of the embodiment is to be described with reference to FIG. 13A and FIG. 13B. FIG. 13A is a perspective view of transmissive fluorescence emitting module 1*a* according to this variation. FIG. 13B is an exploded perspective view of transmissive fluorescence emitting module 1*a* according to this variation.

Transmissive fluorescence emitting module 1*a* according to this variation includes fluorescent substrate 10, metal member 20*a*, rotator 30, and two light emitters 200. Note that FIG. 13A and FIG. 13B illustrate one light emitter 200 for convenience.

Thus, transmissive fluorescence emitting module 1*a* according to this variation is different from transmissive fluorescence emitting module 1 according to the embodiment in that metal member 20*a* is provided instead of metal member 20.

Here, metal member 20*a* is to be described. Metal member 20*a* has a similar configuration to that of metal member 20 except its shape. Metal member 20*a* includes main body 21*a* and a plurality of radiator fins 22*a*.

Main body 21*a* is a plate-shaped member stacked over fluorescent substrate 10.

The shape of main body 21*a* is circular in the plan view. Furthermore, second through-hole H2 is provided in main body 21*a*, and thus the shape of main body 21*a* is an annular ring shape.

Main body 21 includes first side surface 213*a*. First side surface 213*a* protrudes from fluorescent substrate 10 in the vertical direction, and thus extends in a direction parallel to the z axis, as illustrated in FIG. 13A.

Furthermore, radiator fins 22*a* that metal member 20*a* includes are to be described. Radiator fins 22*a* are projections that protrude in a direction opposite the direction from main body 21 to fluorescent substrate 10.

As illustrated in FIG. 13A and FIG. 13B, here, twelve radiator fins 22*a* are provided. In the plan view, twelve radiator fins 22*a* radially extend.

Radiator fins 22*a* each include second side surface 221*a* at a position most distant from axis B1. Second side surfaces 221*a* of radiator fins 22*a* extend in a direction parallel to the z axis, similarly to first side surface 213*a*. Furthermore, second side surfaces 221*a* and first side surface 213*a* of main body 21*a* are connected flush with each another. Second side surfaces 221*a* and first side surface 213*a* are parallel to one another at connected portions.

Fluorescent substrate 10 according to Variation 1 includes annular ring-shaped region A2 that does not overlap metal member 20*a* in the plan view. Note that region A2 corresponds to a region between two circles indicated by the dash-dot lines in FIG. 13B.

As described above, transmissive fluorescence emitting module 1*a* includes fluorescent substrate 10, metal member 20*a*, rotator 30, and two light emitters 200. Accordingly, similarly, to transmissive fluorescence emitting module 1 according to Embodiment 1, transmissive fluorescence emitting module 1*a* that can enhance efficiency of light usage can be produced.

Variation 2 of Embodiment

Next, a transmissive fluorescence emitting module according to Variation 2 of the embodiment is to be described with reference to FIG. 14.

Figure 14:
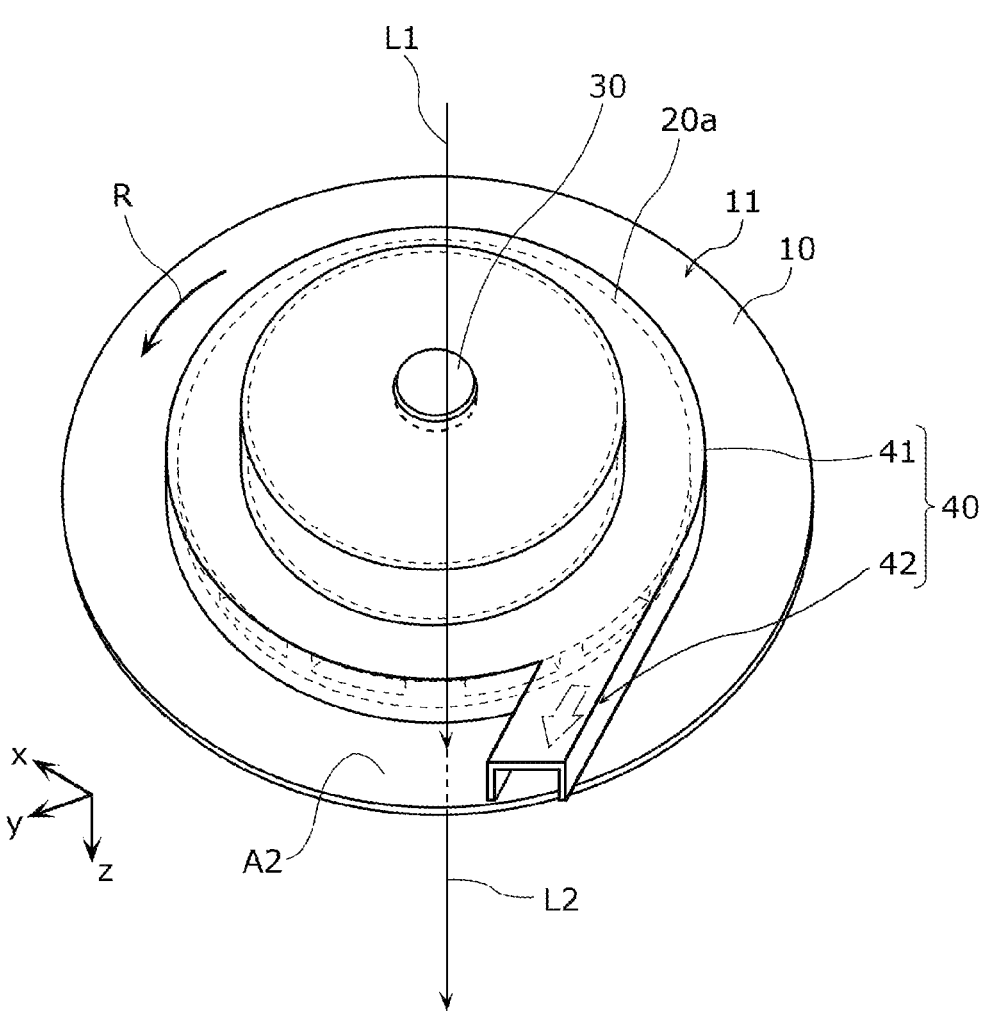
FIG. 14 is a perspective view of a transmissive fluorescence emitting module according to Variation 2 of the embodiment.

FIG. 14 is a perspective view of a transmissive fluorescence emitting module according to Variation 2 of the present embodiment. Note that FIG. 14 omits illustration of light emitters 200.

The transmissive fluorescence emitting module according to this variation is different from transmissive fluorescence emitting module 1*a* in that cover 40 is provided in addition to the elements that transmissive fluorescence emitting module 1*a* according to Variation 1 includes.

Cover 40 is a resin or metal member that includes cover main body 41 and channel 42. Cover 40 is not rotated by rotator 30.

Cover main body 41 is a member covering fluorescent substrate 10 and metal member 20*a*. In this variation, a portion of rotator 30 is exposed from a circular hole provided in cover main body 41 on the z-axis negative side. Thus, cover main body 41 covers the other portion of rotator 30, fluorescent substrate 10, and metal member 20*a*. Since such cover main body 41 is provided, air currents generated when rotator 30 rotates fluorescent substrate 10 and metal member 20*a* can be controlled.

Channel 42 is a member connected to cover main body 41. In the plan view, channel 42 is provided at a position that overlaps region A2 where excitation light L1 enters. Furthermore, the controlled air currents flow through channel 42.

Since cover 40 has the above configuration, air currents generated when rotator 30 rotates fluorescent substrate 10, for instance, flow toward region A2. More specifically, the air currents pass over region A2 on the z-axis negative side. Note that FIG. 14 illustrates an example of such an air current using an arrow shown by the dash-dot line. Fluorescent substrate 10 is cooled by the generated air currents. Thus, a thermal quenching phenomenon does not readily occur and a decrease in fluorescence is reduced, and thus efficiency of light usage achieved by the transmissive fluorescence emitting module according to this variation can be further enhanced.

Variation 3 of Embodiment

Next, a transmissive fluorescence emitting module according to Variation 3 of the embodiment is to be described with reference to FIG. 15.

Figure 15:
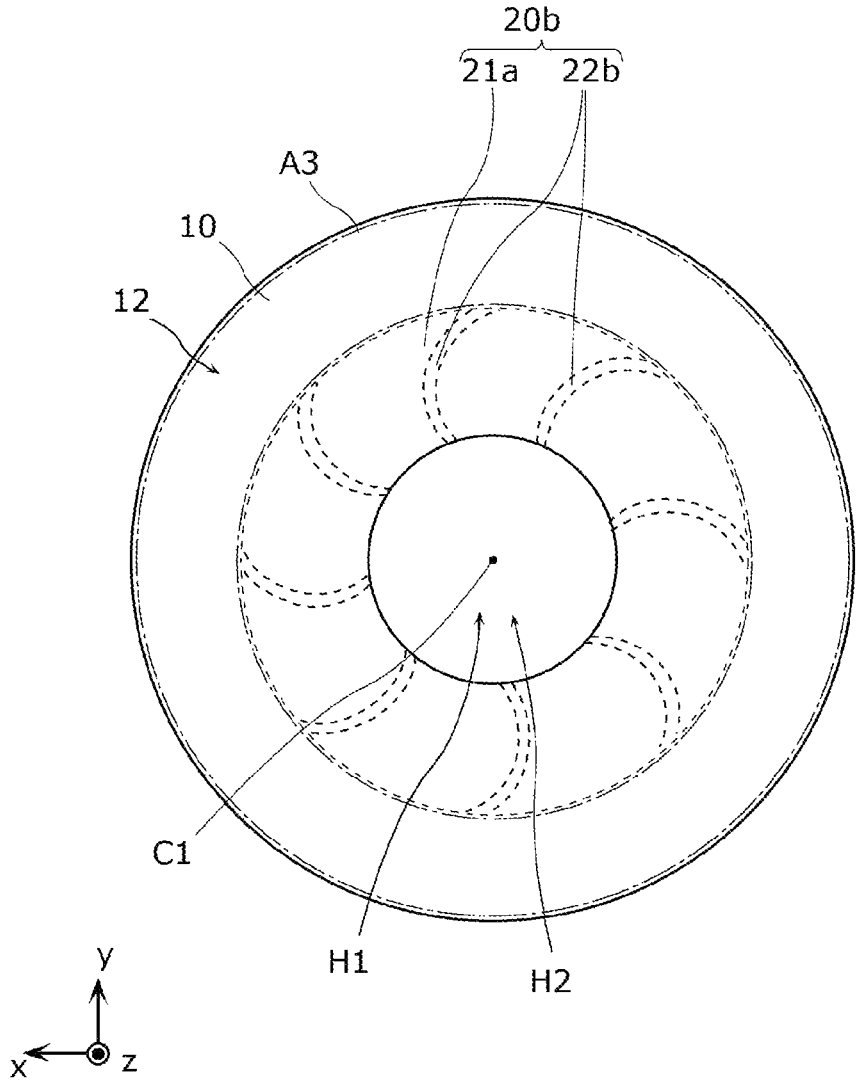
FIG. 15 is a bottom view of a fluorescent substrate and a metal member according to Variation 3 of the embodiment.

FIG. 15 is a bottom view of fluorescent substrate 10 and metal member 20*b* according to Variation 3 of the present embodiment. In FIG. 15, rotator 30 and light emitters 200 are omitted. Note that region A3 that fluorescent substrate 10 according to Variation 3 includes corresponds to a region between two circles indicated by the dash-dot lines in FIG. 15.

In this variation, the shape of radiator fins 22*b* is different from the shape of radiator fins 22 shown in the above embodiment. Radiator fins 22*b* have a curved arc shape in the bottom view. In other words, radiator fins 22*b* have a spiral shape. Since radiator fins 22*b* have such a shape, air currents having a still higher flow velocity are generated when rotator 30 rotates fluorescent substrate 10, for instance.

Other Embodiments

The above has described, for instance, transmissive fluorescence emitting module 1 according to the present invention, based on the embodiment and variations, but nevertheless the present invention is not limited to the embodiment and variations. The scope of the present invention includes embodiments resulting from applying various modifications, which may be conceived by those skilled in the art, to the embodiment and the variations, and other embodiments constructed by combining some elements in the embodiment and the variations, without departing from the gist of the present invention.

Note that it is sufficient if transmissive fluorescence emitting module 1 according to the present embodiment includes fluorescent substrate 10, metal member 20, and rotator 30. In the plan view of fluorescent substrate 10, fluorescent substrate 10 desirably includes annular ring-shaped region A1 that does not overlap metal member 20.

By providing metal member 20, heat is readily dissipated from fluorescent substrate 10. Accordingly, a thermal quenching phenomenon does not readily occur, and thus a decrease in fluorescence can be reduced.

Furthermore, transmissive fluorescence emitting module 1 does not include, for instance, an element for supporting fluorescent substrate 10. Accordingly, loss of excitation light L1 as stated above does not occur, and thus excitation light L1 that enters fluorescent substrate 10 increases. As a result, fluorescence generated by the fluorescent material in fluorescent substrate 10 increases.

In addition, by providing rotator 30, fluorescent substrate 10, for instance, is rotated about axis B1, thus generating air currents. Fluorescent substrate 10 is cooled by the generated air currents. Accordingly, a rise in temperature of fluorescent substrate 10 can be reduced even when fluorescent substrate 10 is irradiated with excitation light L1, and thus a thermal quenching phenomenon does not readily occur and a decrease in fluorescence is reduced.

To summarize the above, in transmissive fluorescence emitting module 1, a thermal quenching phenomenon does not readily occur and excitation light L1 is less likely to be lost, and thus efficiency of light usage can be increased.

Various changes, replacement, addition, and omission, for instance, can be made to the embodiment and variations described above within the scope of the claims and the equivalents thereof.

REFERENCE SIGNS LIST

1, 1a transmissive fluorescence emitting module
10 fluorescent substrate
20 metal member
21, 21a main body
22 radiator fin
30 rotator
40 cover
41 cover main body
42 channel
200 light emitter
211 first principal surface
212 second principal surface
213, 213a first side surface
221, 221a second side surface
500 projector
A1, A1x, A2, A3 region
B1 axis
H1 first through-hole
H2 second through-hole
L1 excitation light
M1, M2 measurement line
The invention claimed is:

1. A transmissive fluorescence emitting module comprising:
   a fluorescent substrate that consists essentially of a fluorescent material;

a metal member bonded to a principal surface that the fluorescent substrate includes; and
a rotator that rotates the fluorescent substrate and the metal member about an axis extending in a thickness direction of the fluorescent substrate,
wherein in a plan view of the fluorescent substrate, the fluorescent substrate includes a region that does not overlap the metal member, the region being annular ring-shaped,
the fluorescent substrate includes another principal surface that is on an opposite side from the principal surface of the fluorescent substrate,
when excitation light that excites the fluorescent material enters the region from the principal surface, light resulting from converting a wavelength of the excitation light that has entered exits through the another principal surface,
the metal member includes a plurality of radiator fins, and
each of the plurality of radiator fins includes a side surface at a position most distant from the axis, the side surface including a slanting surface that is slanted towards the axis in a direction from the another principal surface to the principal surface.

2. The transmissive fluorescence emitting module according to claim 1,
   wherein the metal member includes a main body stacked over the fluorescent substrate, the main body being plate-shaped.

3. The transmissive fluorescence emitting module according to claim 2,
   wherein in the plan view of the fluorescent substrate, the main body is circularly shaped,
   the main body includes:
      a first principal surface bonded to the principal surface of the fluorescent substrate; and
      a second principal surface on an opposite side from the first principal surface, and the first principal surface has an area greater than an area of the second principal surface.

4. The transmissive fluorescence emitting module according to claim 2,
   wherein in the plan view of the fluorescent substrate, the main body and the region are adjacent to each other.

5. The transmissive fluorescence emitting module according to claim 1,
   wherein in the plan view of the fluorescent substrate, the plurality of radiator fins extend radially about the axis.

6. The transmissive fluorescence emitting module according to claim 2,
   wherein the fluorescent substrate includes a first through-hole penetrating therethrough in the thickness direction,
   the main body includes a second through-hole penetrating therethrough in the thickness direction, and
   in the plan view of the fluorescent substrate, at least a portion of the first through-hole overlaps at least a portion of the second through-hole.

7. The transmissive fluorescence emitting module according to claim 6, further comprising:
   a cover that includes a cover main body and a channel through which an air current flows, the cover main body covering the fluorescent substrate and the metal member, the channel being connected to the cover main body, the air current being generated when the rotator rotates the fluorescent substrate and the metal member,
   wherein in the plan view of the fluorescent substrate, the channel overlaps the region.

8. The transmissive fluorescence emitting module according to claim 1, further comprising:

a light emitter that emits the excitation light that excites the fluorescent material and enters the region.

9. A light emitting device comprising:

the transmissive fluorescence emitting module according to claim 1.

* * * * *